(12) United States Patent
Park et al.

(10) Patent No.: US 7,778,091 B2
(45) Date of Patent: Aug. 17, 2010

(54) PAGE BUFFER, MEMORY DEVICE HAVING THE PAGE BUFFER AND METHOD OF OPERATING THE SAME

(75) Inventors: Se-Chun Park, Seoul (KR); Jong-Hyun Wang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 190 days.

(21) Appl. No.: 12/019,938

(22) Filed: Jan. 25, 2008

(65) Prior Publication Data

US 2009/0097313 A1 Apr. 16, 2009

(30) Foreign Application Priority Data

Oct. 12, 2007 (KR) .............. 10-2007-0102948

(51) Int. Cl.
*G11C 7/10* (2006.01)

(52) U.S. Cl. .................. 365/189.05; 365/185.03
(58) Field of Classification Search .......... 365/185.03, 365/189.05
See application file for complete search history.

(56) References Cited

U.S. PATENT DOCUMENTS

| 2008/0123411 A1* | 5/2008 | Crippa et al. | 365/185.03 |
| 2008/0175063 A1* | 7/2008 | Son et al. | 365/185.22 |

FOREIGN PATENT DOCUMENTS

| KR | 1020060112413 A | 11/2006 |
| KR | 1020060124856 A | 12/2006 |
| KR | 1020070018221 A | 2/2007 |
| KR | 1020070033667 A | 3/2007 |

* cited by examiner

*Primary Examiner*—Hoai V Ho
*Assistant Examiner*—Anthan T. Tran
(74) *Attorney, Agent, or Firm*—Townsend and Townsend and Crew LLP

(57) ABSTRACT

A page buffer includes a first latch coupled between a sensing node and a data input/output node for storing data to be programmed. The sensing node is coupled to a bit line corresponding to an MLC selected for programming. The data input/output node receives/outputs data. A second latch is coupled to the sensing node for performing a program, verifying or read operation. A first switching means is coupled between the first latch and the sensing node for transmitting data stored in the first latch to the bit line through the sensing node when the program operation is performed. A second switching means is coupled to a first node of the second latch and the sensing node for verifying a first program operation. A third switching means is coupled between a second node of the second latch and the sensing node for verifying a second program operation.

11 Claims, 14 Drawing Sheets

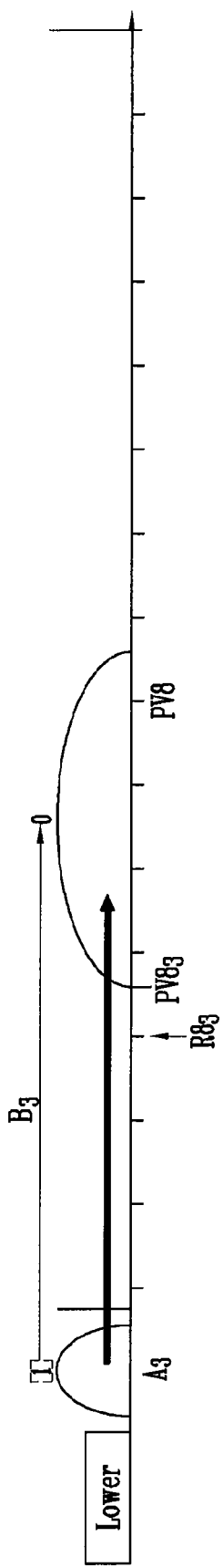
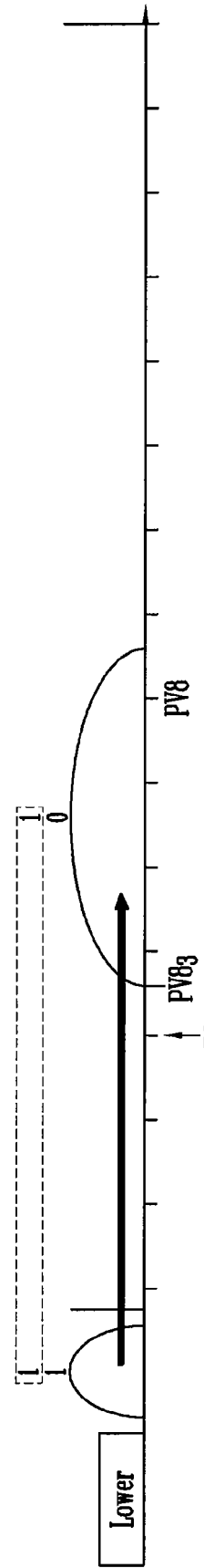
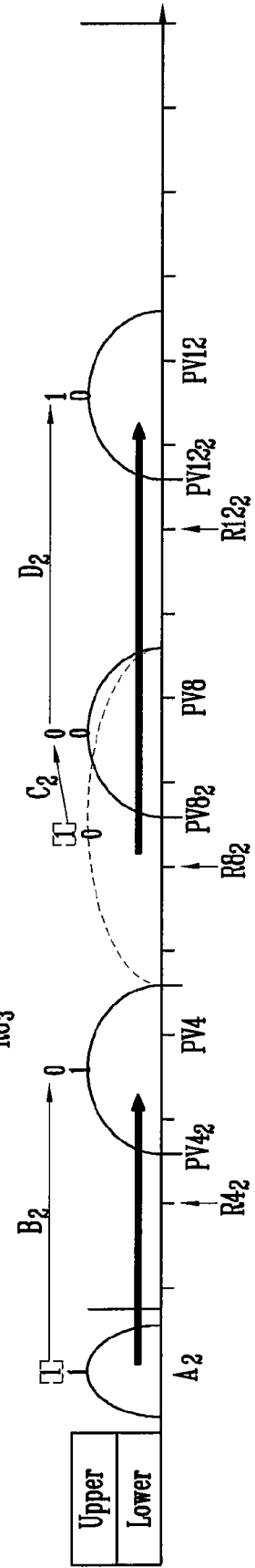
FIG. 2A
FIG. 2B

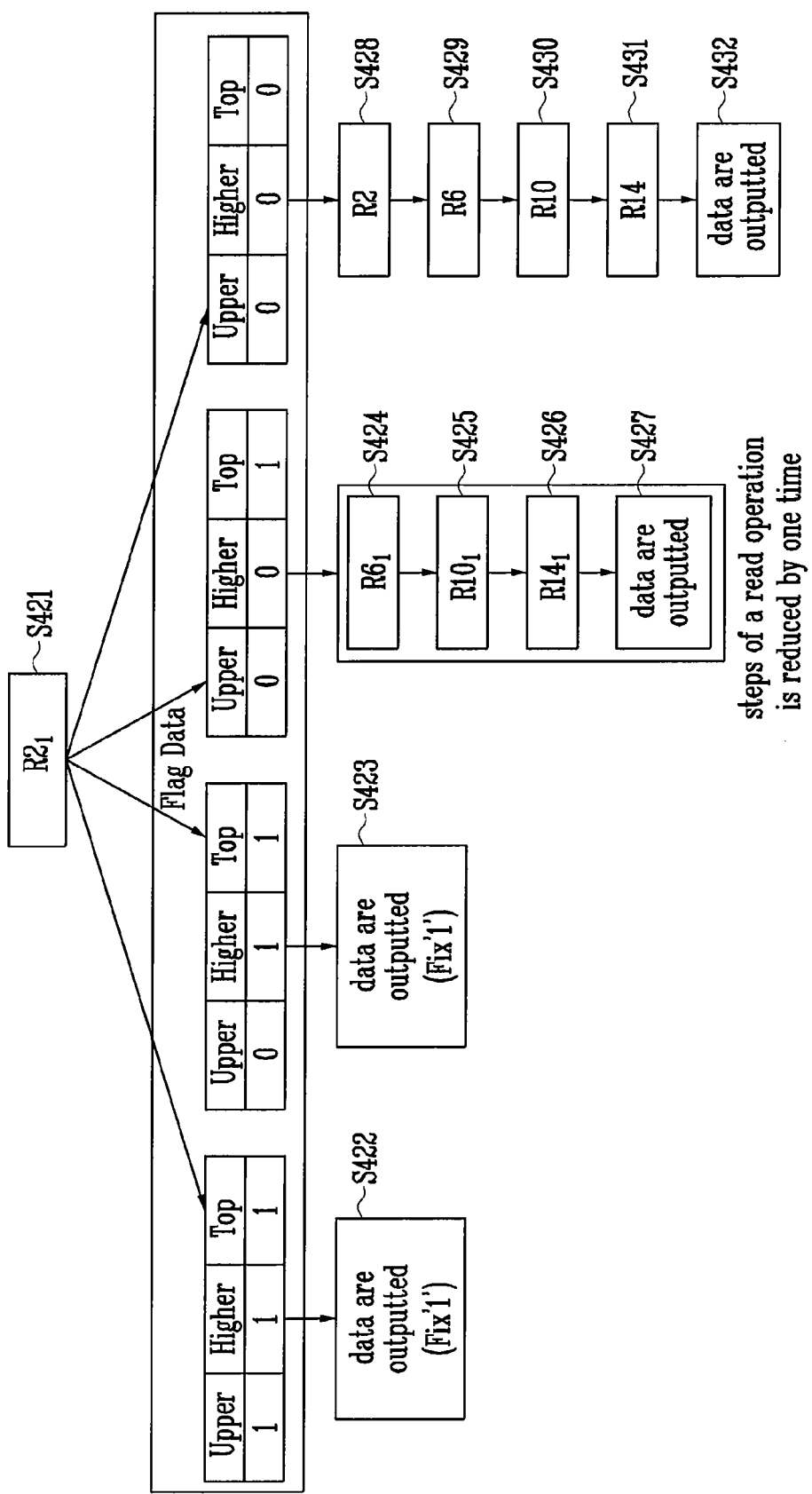

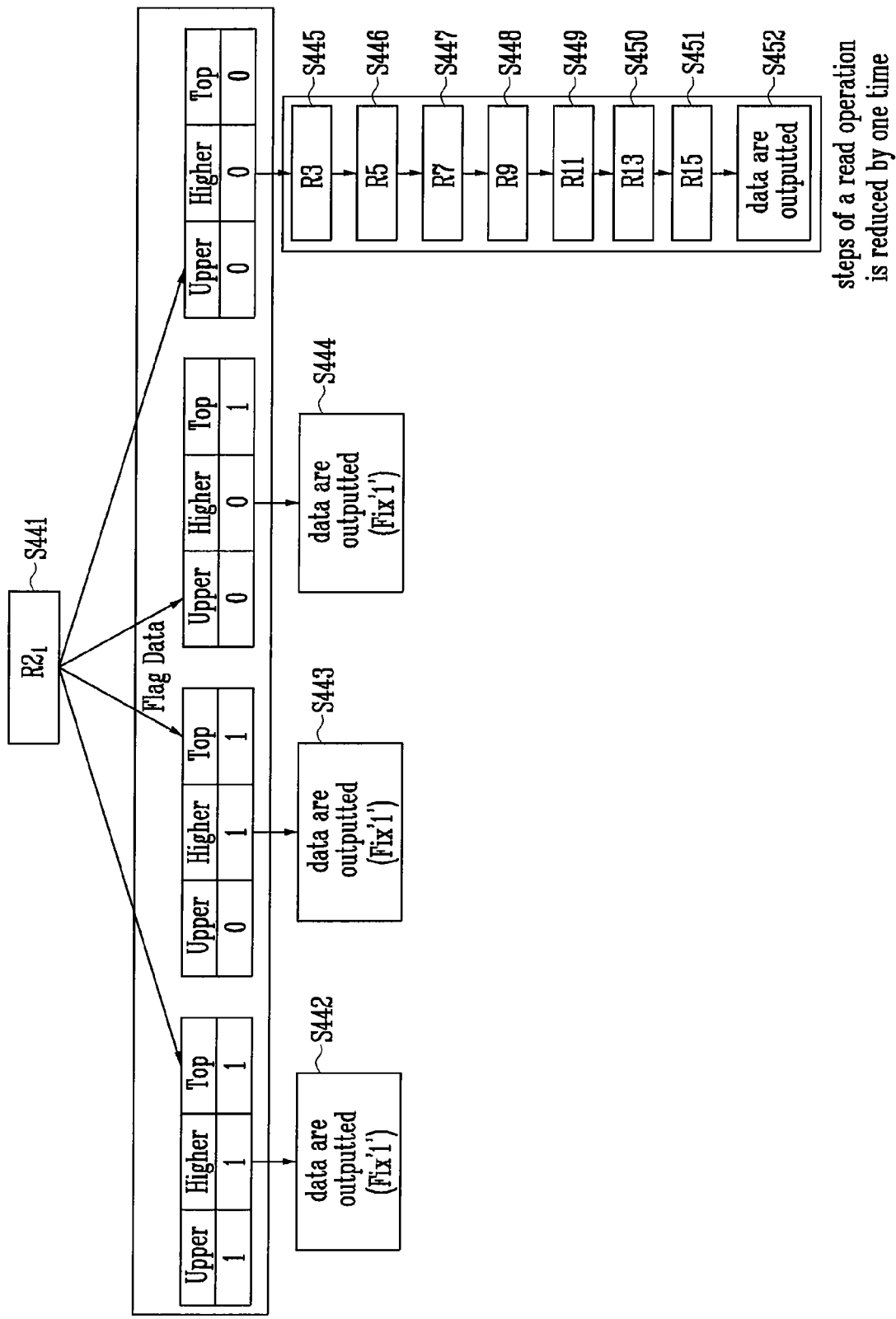

PAGE BUFFER, MEMORY DEVICE HAVING THE PAGE BUFFER AND METHOD OF OPERATING THE SAME

CROSS-REFERENCE TO RELATED APPLICATIONS

This application claims priority from Korean Patent Application No. 2007-102948, filed on Oct. 12, 2007, the contents of which are incorporated herein by reference in its entirety.

BACKGROUND OF THE INVENTION

The present invention relates to a method of operating a memory device having a multi level cell (MLC). More particularly, the present invention relates to a page buffer for programming the MLC using gray code, a memory device having the page buffer and a method of operating the same.

A well-known NAND flash memory includes a memory cell array, a column decoder, and a page buffer. The memory cell array consists of a plurality of word lines extended along columns, a plurality of bit lines extended along rows and a plurality of cell strings corresponding to the bit lines.

A row decoder connected to a string select line, the word lines and a common source line is located at one side of the memory cell array, and the page buffer connected to the bit lines is located at the other side of the memory cell array.

Multi bit cells for storing a plurality of data bits in one memory cell have been recently developed to enhance the degree of integration of a flash memory. This memory cell is referred to as a multi level cell (hereinafter, referred to as "MLC"). A memory cell for storing one data bit is referred to as a single level cell (SLC).

FIG. 1 is a view illustrating common threshold voltage distribution of MLC for storing 2 data bits.

Referring to FIG. 1, the MLC for storing 2 data bits has four threshold voltage distributions, i.e. threshold voltage distribution [11] not programmed, and threshold voltage distributions [10], [00], and [01] corresponding to a program state.

A program operation includes a least significant bit (LSB) program and a most significant bit MSB program. The LSB program programs [11] state to [10] state in step S101. In addition, the MSB program is performed after the LSB program is performed, and programs [10] state to [00] state in step S102 or programs [11] state to [01] state in step S103.

This program operation programs the MLC using gray code, and changes only one of the bits.

Specifically, in FIG. 1, '1' is changed into '0', i.e. only one bit is changed by one program operation. This program method is applied to the MLC for storing n (an integer) bits as well as two bits. Although an error may occur in one memory cell, the error affects only one of the bits in the memory cell. Thus, the program method uses gray code. Accordingly, memory cells having a threshold voltage of [11] state may be changed to [10] state or [01] state.

A threshold voltage is shifted by Vt1 when [11] state is changed into [10] state, a threshold voltage is shifted by Vt2 when [10] state is changed into [00] state, and a threshold voltage is shifted by Vt3 when [11] state is changed into [01] state. Here, Vt3 is higher than Vt1 and Vt2 as shown in FIG. 1. When the threshold voltage is shifted considerably, an interference effect may occur between the memory cell corresponding to the threshold voltage and an adjacent memory cell. As a result, characteristics of the adjacent memory cell may deteriorate due to the interference effect. In addition, a failure may occur in the memory cell.

SUMMARY OF THE INVENTION

It is a feature of the present invention to provide a page buffer using gray code to minimize a shift of threshold voltage distribution in a program operation, a verifying operation and a read operation, a memory device having the page buffer, and a method of operating the same.

A page buffer in a memory device having a multi level cell according to one example embodiment of the present invention includes a first latch coupled between a sensing node and a data input/output node, and configured to store temporarily data to be programmed, wherein the sensing node is coupled to a bit line corresponding to a multi level cell selected for program, and the data input/output node receives data from an outside device or outputs data to the outside device; a second latch coupled to the sensing node, and configured to perform a program operation, a verifying operation or a read operation for reading data from the selected multi level cell; a first switching means coupled between the first latch and the sensing node, and configured to transmit the data stored in the first latch to the bit line through the sensing node when the program operation is performed; a second switching means coupled to a first node of the second latch and the sensing node, and configured to verify a first program operation of first data; and a third switching means coupled between a second node of the second latch and the sensing node, and configured to verify a second program operation of second data.

The page buffer further includes a bit line selecting circuit configured to couple a selected bit line to the sensing node, wherein the bit line is selected when the program operation or the read operation is performed.

Data '1' is converted into data '0' in the first program operation, and the second program operation corresponds to the program operation except the first program operation.

Data '0' is converted into data '1' in the first program operation, and the second program operation corresponds to the program operation except the first program operation.

The second switching means or the third switching means operates in accordance with a first verifying voltage for verifying the first program operation and a second verifying voltage for verifying the second program operation.

A memory device having a multi level cell according to one example embodiment of the present invention includes a memory cell array configured to have a plurality of multi level cells coupled to pairs of bit lines and word lines; page buffers corresponding to each of the pairs of the bit lines, configured to output data to be programmed to one of the multi level cells coupled to one pair of the bit lines when a program operation is performed, and verify the program operation through at least two switching means; and a controller configured to control the program operation, and control a verifying operation for verifying the program operation by controlling the switching means, wherein the verifying operation is performed in accordance with a verifying voltage.

The page buffer includes a first latch coupled between a sensing node and a data input/output node, and configured to store temporarily data to be programmed, wherein the sensing node is coupled to the bit line corresponding to a multi level cell selected for program, and the data input/output node receives data from an outside device or outputs data to the outside device; a second latch coupled to the sensing node, and configured to perform a program operation, a verifying operation or a read operation for reading data from the selected multi level cell; a first switching means coupled between the first latch and the sensing node, and configured to transmit the data stored in the first latch to the bit line through the sensing node when the program operation is performed; a second switching means coupled to a first node of the second latch and the sensing node, and configured to verify a first program operation of first data; and a third switching means coupled between a second node of the second latch and the sensing node, and configured to verify a second program operation of second data.

The page buffer further includes a bit line selecting circuit configured to couple a selected bit line to the sensing node, wherein the bit line is selected when the program operation or the read operation is performed.

Data '1' is converted into data '0' in the first program operation, and the second program operation corresponds to the program operation except the first program operation.

Data '0' is converted into data '1' in the first program operation, and the second program operation corresponds to the program operation except the first program operation.

The second switching means or the third switching means operates in accordance with a first verifying voltage used for verifying the first program operation and a second verifying voltage used for verifying the second program operation.

Information related to operation of the second switching means or the third switching means is stored in a storing means in the controller.

A method of verifying data in a memory device having a page buffer for performing a program operation, a verifying operation and a read operation according to one example embodiment of the present invention includes storing data to be programmed in a multi level cell of a first latching circuit in the page buffer; storing reference data set for the verifying operation in a second latching circuit; programming the data stored in the first latching circuit to the multi level cell; and verifying the programming of the data through a first node or a second node in the second latching circuit in accordance with a verifying voltage.

The method further includes storing in advance information as to whether the verifying operation is performed through the first node or the second node in accordance with a given verifying voltage, wherein the given verifying voltage is set depending on a threshold voltage distribution of the programmed multi level cell, the step of storing the information is performed before the step of programming.

As described above, a page buffer, a memory device having the page buffer, and a method of operating the same use gray code to minimize a shift of a threshold voltage distribution in a program operation, a verifying operation and a read operation, wherein the gray code is used for minimizing an error rate.

BRIEF DESCRIPTION OF THE DRAWINGS

The above and other features and advantages of the present invention will become readily apparent by reference to the following detailed description when considered in conjunction with the accompanying drawings wherein:

FIG. 2A to FIG. 2D are views illustrating a threshold voltage distribution in accordance with a program operation of MLC for storing 4 bits according to one example embodiment of the present invention;

FIG. 4A to FIG. 4D illustrate a read operation of the memory device according to one example embodiment of the present invention;

DESCRIPTION OF SPECIFIC EMBODIMENTS

Hereinafter, the preferred embodiments of the present invention will be explained in detail with reference to the accompanying drawings.

Figure 1:
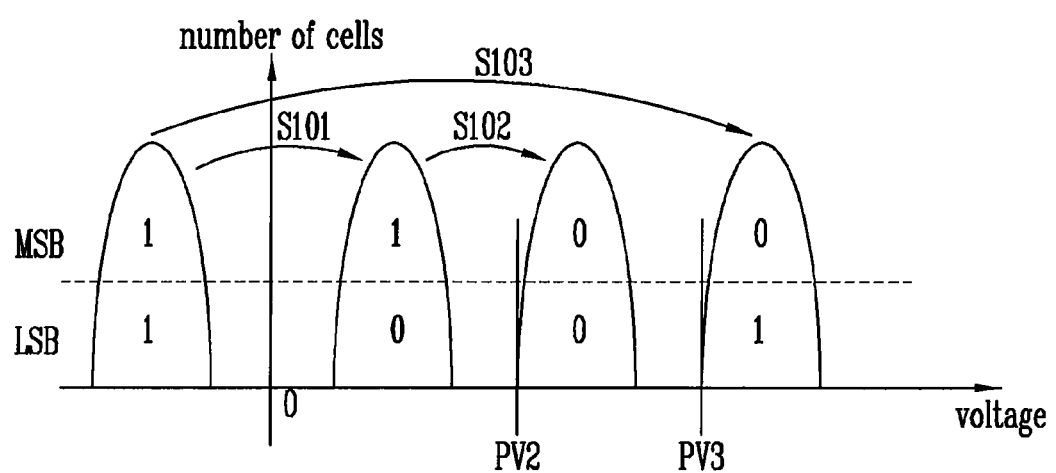
FIG. 1 is a view illustrating a common threshold voltage distribution of MLC for storing 2 bits.
Figure 2C:
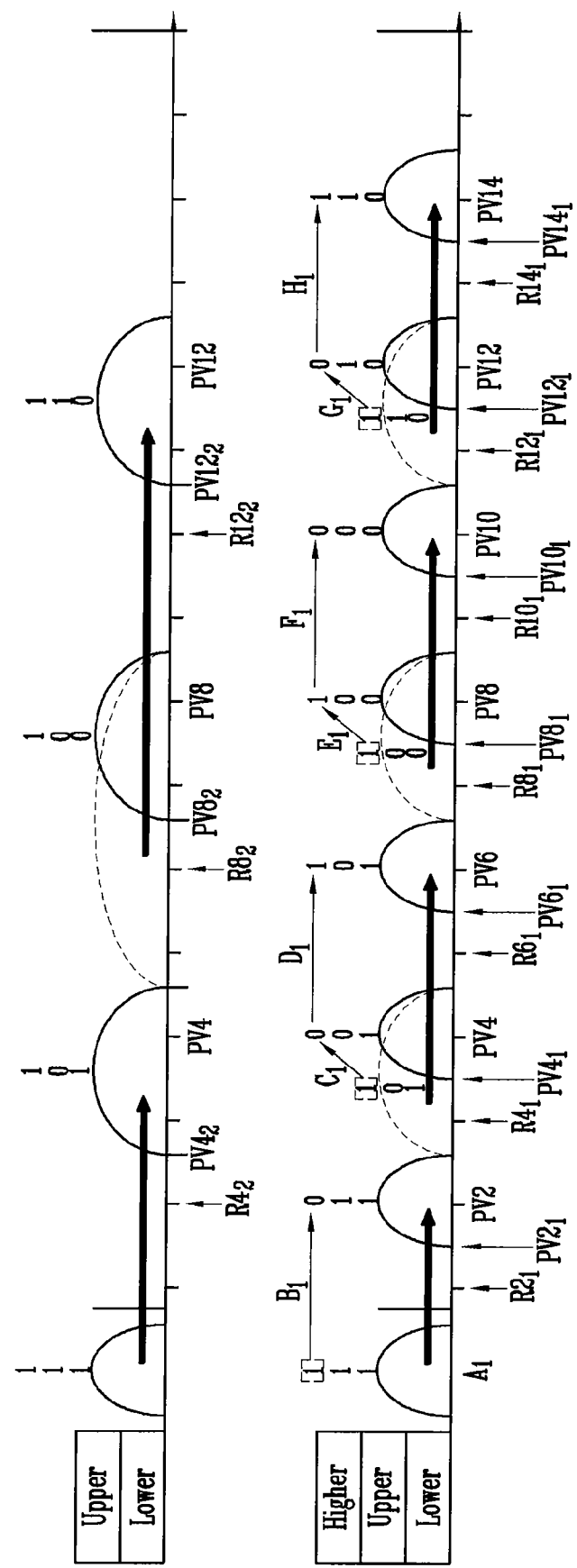
Figure 2D:
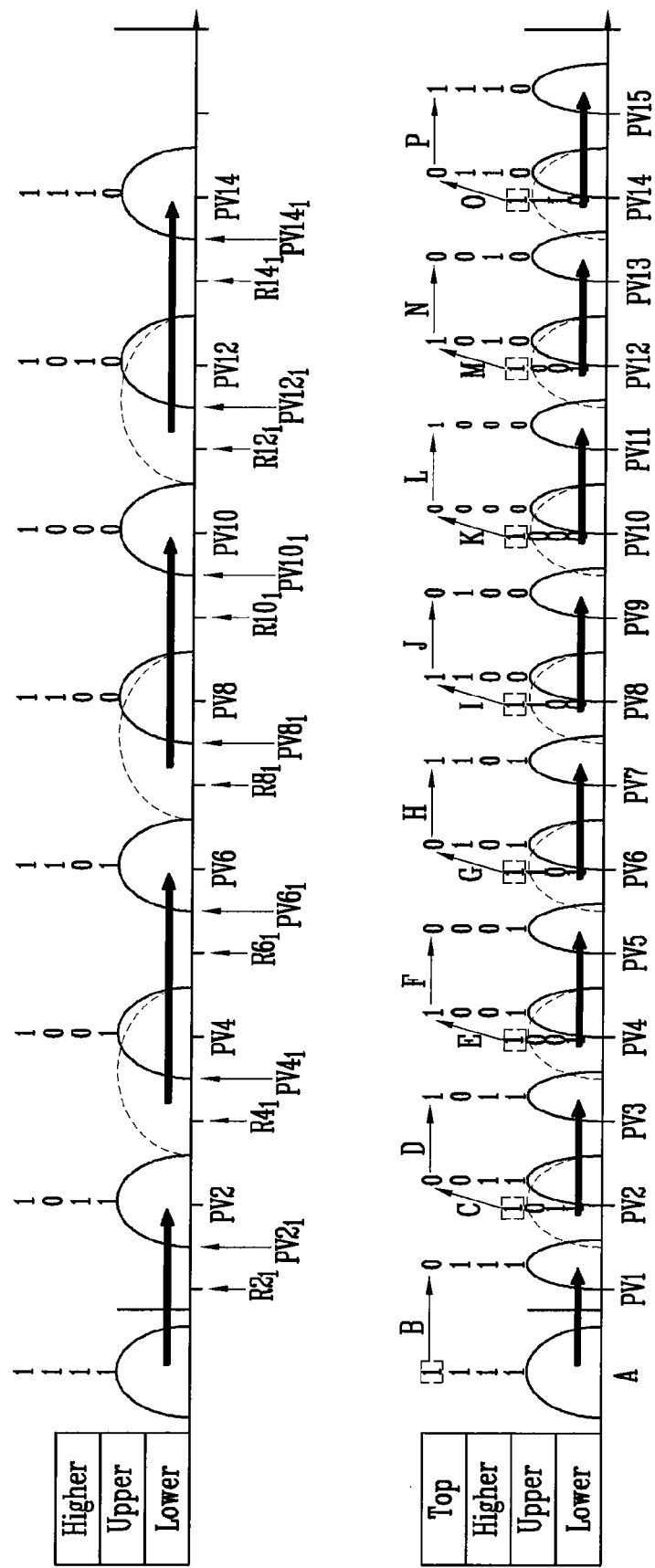

FIG. 2A to FIG. 2D are views illustrating a threshold voltage distribution in accordance with a program operation of MLC for storing 4 bits according to one example embodiment of the present invention. Particularly, FIG. 2A shows a shift of a threshold voltage distribution of a memory cell in accordance with a program of a first bit Lower of four bits, and FIG. 2B illustrates a shift of a threshold voltage distribution of the memory cell in accordance with a program of a second bit Upper of the bits. FIG. 2C shows a shift of a threshold voltage distribution of the memory cell in accordance with a program of a third bit Higher of the bits, and FIG. 2D illustrates a shift of a threshold voltage distribution of the memory cell in accordance with a program of a fourth bit Top of the bits.

In FIG. 2A, the shift of the threshold voltage distribution of the memory cell in accordance with a program of the first bit Lower is shown.

When an LSB program is performed on an erased memory cell, the erased cell is maintained because the program operation is not performed in step A3, or the threshold voltage of the memory cell is changed because lower bit '1' of the erased cell is converted into '0' in step B3.

A verifying operation of the program of the first bit Lower is performed by a verifying voltage $PV8_3$, and data are read by a read voltage $R8_3$.

When the second bit Upper is programmed, the memory cell has four threshold voltage distributions as shown in FIG. 2B.

Hereinafter, the second bit Upper is assumed to be '1' before the second bit Upper is programmed.

In step A2, the erased cell in step A3 of FIG. 2A is maintained. In step B2, the second bit Upper is converted from '1' into '0' as the erased cell is programmed.

In step C2, the second bit Upper of the cell in B3 of FIG. 2A is converted from '1' into '0'. In step D2, the second bit Upper in step C2 is converted from '0' into '1'.

In steps A2, B2, C2 and D2, the program operation uses a gray code method where only one bit is changed. However, the program operation includes step D2 where '0' is converted into '1' as well as steps B2 and C2 where '1' is converted into '0'. That is, the second bit Upper is converted from '1' into '0' in the steps B2 and C2, but is converted from '0' into '1' in the step D2.

A voltage that is different from the voltage in FIG. 2A is used to read or verify data in each of the memory cells. For example, a verifying voltage $PV4_2$ is applied to first memory cells corresponding to a threshold voltage distribution having data state [01]. In addition, a read voltage $R4_2$ is used when data in the first memory cells are read. A verifying voltage $PV8_2$ is applied to second memory cells corresponding to a threshold voltage distribution having data state [00]. Additionally, a read voltage $R8_2$ is used when data in the second memory cells are read. A verifying voltage $PV12_2$ is applied to third memory cells corresponding to a threshold voltage distribution having data state [10]. Furthermore, a read voltage $R12_2$ is used when data in the third memory cells are read.

When the third bit Higher is programmed, the memory cell has eight threshold voltage distributions as shown in FIG. 2C.

Hereinafter, the third bit Higher is assumed to be '1' when a program operation of the third bit Higher is started.

In step A1, data state [111] of the erased cell in step A2 is maintained. In step B1, data state [111] is converted into [011] by programming the erased cell in step A2, and so the threshold voltage of the cell is changed.

In step C1, the cells having the threshold voltage distribution in step B2 of FIG. 2B are programmed, and so the cells have data state [001]. In step D1, the data state [001] is converted into data state [101], and so a corresponding threshold voltage is changed.

In step E1, the data state is converted into [100] when cells having the threshold voltage distribution in step C2 of FIG. 2B are programmed. In step F1, the data state [100] is converted into data state [000] in accordance with the program, and so the threshold voltage of the cell is changed. In step G1, the data state is converted into data state [010] when cells having the threshold voltage distribution in the step D2 of FIG. 2B are programmed. In step H1, data state [010] is converted into data state [110] in accordance with the program, and so the threshold voltage of the cell is changed.

The verifying voltage and the read voltage applied to the cells having the threshold voltage distribution in FIG. 2C are different from those applied to the cells having the threshold voltage distribution in FIG. 2B. In other words, a verifying voltage $PV2_1$ and a read voltage $R2_1$ are applied to the cells having data state [011]. In addition, a verifying voltage $PV4_1$ and a read voltage $R4_1$ are provided to the cells having data state [001].

A verifying voltage $PV6_1$ and a read voltage $R6_1$ are applied to the cells having data state [101], a verifying voltage $PV8_1$ and a read voltage $R8_1$ are provided to the cells having data state [100], and a verifying voltage $PV10_1$ and a read voltage $R10_1$ are applied to the cells having data state [000].

Additionally, a verifying voltage $PV12_1$ and a read voltage $R12_1$ are applied to the cells having data state [010], and a verifying voltage $PV14_1$ and a read voltage $R14_1$ are provided to the cells having data state [110].

When the fourth bit Top is programmed, the memory cell has sixteen threshold voltage distributions as shown in FIG. 2D.

Hereinafter, every fourth bit Top is assumed to be '1' when the program of the fourth bit Top is started.

A process of programming includes step B in which state $A_1$ of the erased cell is converted into data state [0111] through the programming, step C in which the state of the memory cells programmed in the step B2 of FIG. 2C is converted into data state [0011] through the programming, and step D in which data state [0011] is converted into data state [1011].

In addition, the process further includes step E in which the state of the memory cells programmed in the step C2 of FIG. 2C is converted into data state [1001], step F in which the data state [1001] is converted into data state [0001], step G in which the state of the memory cells programmed in the step D2 of FIG. 2C is converted into data state [0101], and step H in which the data state [0101] is converted into data state [1101].

In step I, the state of the memory cells programmed in the step E2 of FIG. 2C is converted into data state [1100] through the programming. In step J, the data state [1100] is converted into data state [0100].

In step K, state of the memory cells programmed in the step F2 of FIG. 2C is converted into data state [0000] through the programming. In step L, the data state [0000] is converted into data state [1000].

In step M, state of the memory cells programmed in the step G2 of FIG. 2C is converted into data state [1010] through the programming. In step N, the data state [1010] is converted into data state [0010].

In step O, state of the memory cells programmed in H2 of FIG. 2C is converted into data state [0110] through the programming. In step P, the data state [0110] is converted into data state [1110].

A verifying voltage and a read voltage different from the voltages in FIG. 2A to FIG. 2C are used to read or verify data in each of the memory cells having the above sixteen threshold voltage distributions.

That is, a first verifying voltage PV1 and a first read voltage R1 are applied to the memory cells having the threshold voltage distribution corresponding to the data state [0111], and a second verifying voltage PV2 and a second read voltage R2 are provided to the memory cells having the threshold voltage distribution corresponding to the data state [0011]. In addition, verifying voltages PV3 to PV15 and read voltages R3 to R15 are applied to corresponding memory cells having the threshold voltage distributions corresponding to the other data states as shown in FIG. 2D, respectively.

As described above, the MLC for storing 4 bits has 16 threshold voltage distributions. The verifying voltage and the read voltage are changed depending on the steps in accordance with the programming. Accordingly, to perform the verifying operation or the read operation, the program step of the memory cell should be verified. In one example embodiment of the present invention, the memory device has a flag cell, and verifies the program step of the memory cell using the flag cell. Then, the memory device applies the verifying voltage and the read voltage in accordance with the verified program step.

In case of the MLC for storing 4 bits, the memory device should have three flag cells to verify the program of the second bit Upper, the program of the third bit Higher and the fourth bit Top. Each of the flag cells is made of the SLC. Hence, when the flag cells corresponding to the second bit Upper to the fourth bit Top have state [111], the first bit Lower is programmed. When the flag cells have state [011], the first bit Lower and the second bit Upper are programmed. When the flag cells have state [001], the first bit Lower to the third bit Higher are programmed. When the flag cells have state [000], the first bit Lower to the fourth bit Top are programmed.

Additionally, the number of the flag cells is increased as the number of bits stored in the MLC is augmented. Accordingly, the memory device may use an MLC for storing 2 bits as the flag cell in order to reduce the number of the flag cells.

Hereinafter, structure and operation of the memory device having the MLC for storing four bits will be described in detail with reference to the accompanying drawings.

Figure 3A:
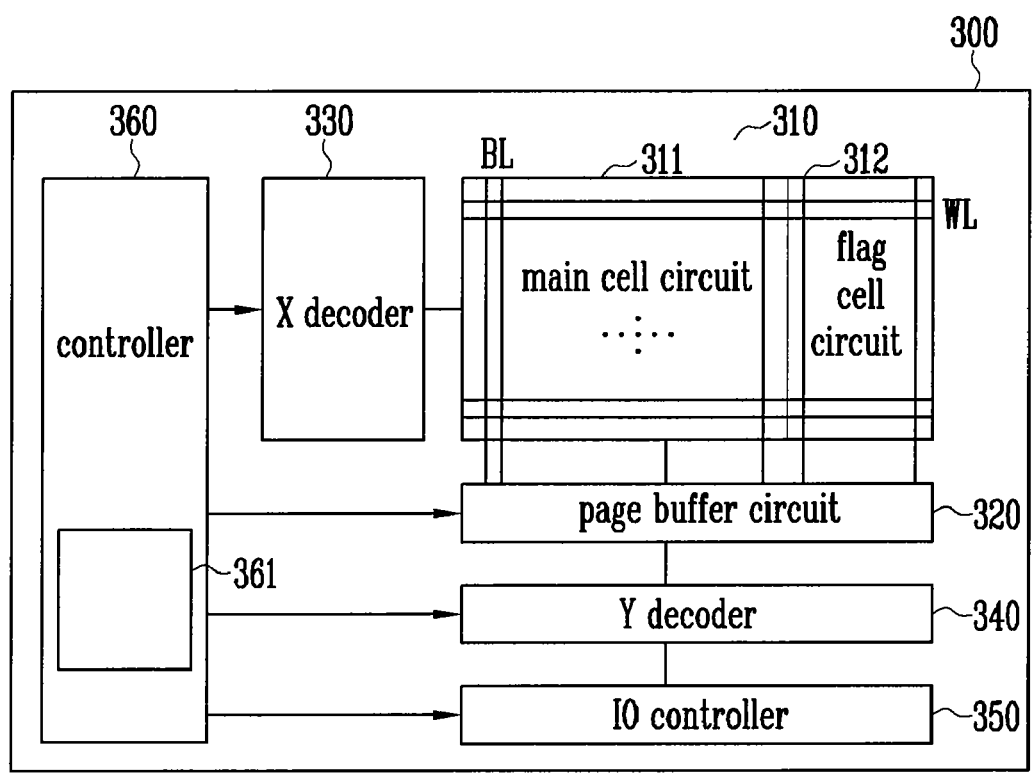
FIG. 3A is a block diagram illustrating a memory device having the MLC according to one example embodiment of the present invention.

FIG. 3A is a block diagram illustrating a memory device having the MLC according to one example embodiment of the present invention. FIG. 3A shows a part of the memory device having the MLC for storing four bits.

In FIG. 3A, the memory device 300 includes a memory cell array 310 having memory cells coupled to bit lines BL and word lines WL and for storing data; a page buffer circuit 320 having page buffers which are coupled to a pair of the bit lines, for programming data in the memory cell or reading data from the memory cell; an X decoder 330 for selecting one of the word lines WL in the memory cell array 310 in accordance with an input address; a Y decoder 340 for selecting the page buffer in accordance with the input address; an IO controller 350 for outputting data transmitted through the Y decoder 340 to an outside device or providing data transmitted from the outside device to the Y decoder 340; and a controller 360 for controlling the memory cell array 310, the page buffer circuit 320, the X decoder 330, the Y decoder 340 and the IO controller 350.

The controller 360 has a storing means 361 for storing a control algorithm for controlling operation of the memory device, control information, etc.

The word line corresponding to the MLC for storing four data bits has four pages. Hence, the MLC is generally programmed in a unit of a page.

The memory cell array 310 includes a main cell circuit 311 having memory cells for storing four data bits and a flag cell circuit 312 having at least one flag cell. A program state of the main cell circuit 311 is indicated in a unit of the page using the flag cell.

The flag cell corresponds to each of the pages. When the main cell circuit 311 has a memory cell for storing four bits, a first flag cell indicating the program state of the first bit Lower and the second bit Upper, a second flag cell indicating the program state of the first bit Lower to the third bit Higher, and a third flag cell indicating the program state of the first bit Lower to the fourth bit Top as described in FIG. 2A to FIG. 2D are assigned to each of the pages. Here, each of the flag cells is the SLC.

It is impossible to repair the flag cell or correct an error that occurred to the flag cell. Accordingly, in the case of laying out the page buffers with eight steps, the flag cells are disposed in each of the steps so that 8IO to 32IO exist. Here, only three of the other page buffers except the first page buffer are selected, and the flag cells corresponding to the selected page buffers operate as the flag cells indicating the program state mentioned above.

In the page buffer circuit 320, are the page buffers coupled to a pair of bit lines for performing a program operation, a verifying operation and a read operation on the memory cell coupled to a selected bit line.

Hereinafter, operation of the page buffer will be described in detail with reference to the accompanying drawings.

Figure 3B:
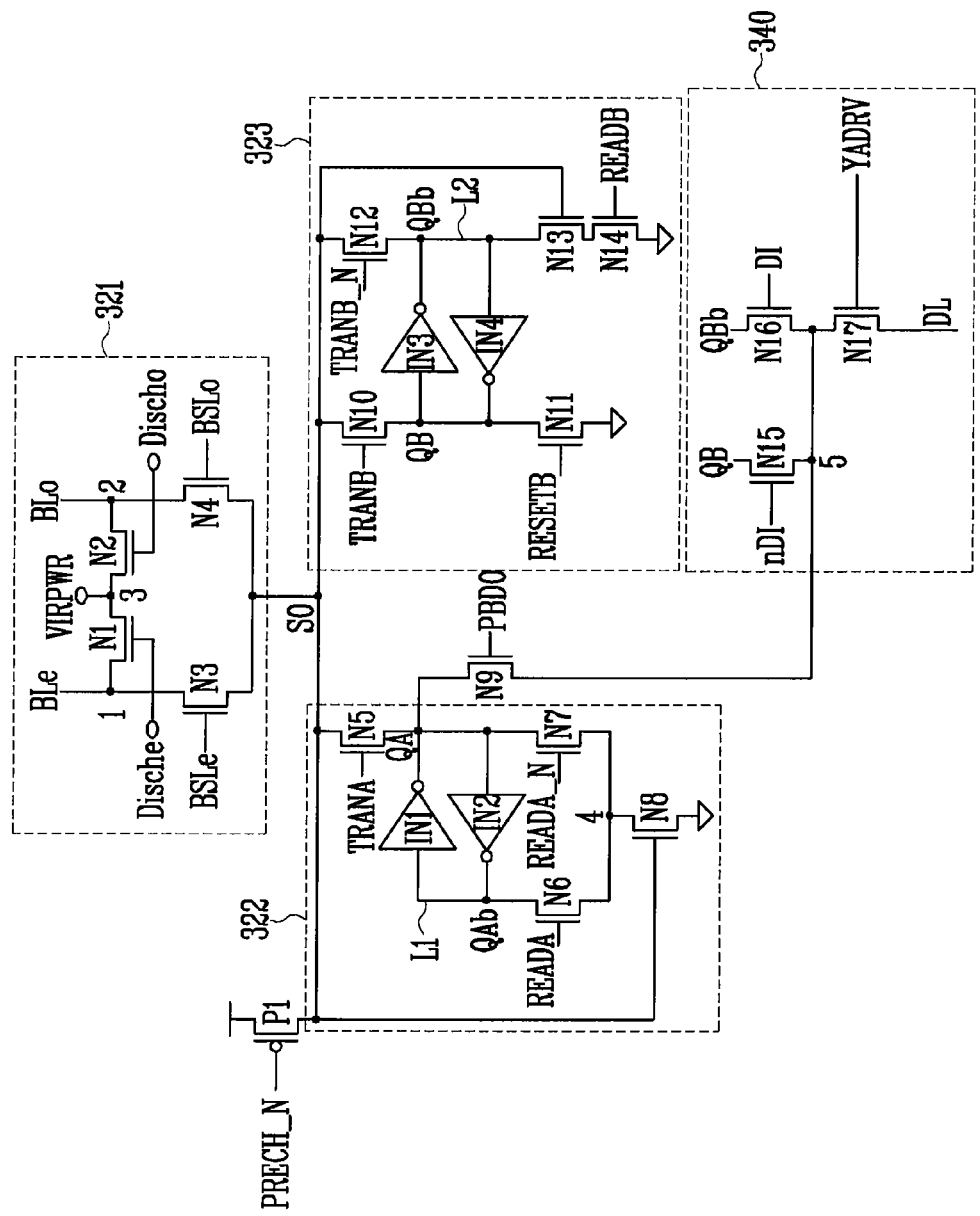
FIG. 3B is a view illustrating the page buffer of the page buffer circuit in FIG. 3A.

FIG. 3B is a view illustrating the page buffer of the page buffer circuit in FIG. 3A.

In FIG. 3B, the page buffer includes a bit line selecting circuit 321 for selecting one of bit lines BLe and BLo; latching circuits 322 and 323 for performing a program operation, a verifying operation or a read operation on data in the memory cell; and a first P-MOS transistor P1 for precharging. In addition, the page buffer inputs/outputs data through the Y decoder 340.

The bit line selecting circuit 321 has a first N-MOS transistor N1 to a fourth N-MOS transistor N4.

The first latching circuit 322 includes a fifth N-MOS transistor N5 to an eighth N-MOS transistor N8, a first inverter IN1 and a second inverter IN2.

The second latching circuit 323 has a tenth N-MOS transistor N10 to a fourteenth N-MOS transistor N14, a third inverter IN3 and a fourth inverter IN4.

Additionally, the page buffer further includes a ninth N-MOS transistor N9 for transmitting data stored in the first latching circuit 322 to the Y decoder 340.

The first N-MOS transistor N1 and the second N-MOS transistor N2 in the bit line selecting circuit 321 are coupled in serial between a first node 1 and a second node 2. An even bit line discharge signal Dische is input to a gate of the first N-MOS transistor N1, and an odd bit line discharge signal Discho is input to a gate of the second N-MOS transistor N2.

The third N-MOS transistor N3 is coupled between the first node 1 and a sensing node SO, and is driven by an even bit line selecting signal BLe.

The fourth N-MOS transistor N4 is coupled between the second node 2 and the sensing node SO, and is driven by an odd bit line selecting signal BLo.

The first latching circuit 322 and the second latching circuit 323 are coupled to the sensing node SO.

The first P-MOS transistor P1 is coupled between a power supply voltage and the sensing node SO, and is driven by a precharge signal PRECH_N.

The fifth N-MOS transistor N5 in the first latching circuit 322 is coupled between the sensing node SO and a node QA, and operates in accordance with a control signal TRANA, thereby transmitting the data stored in the first latching circuit 322 to the bit line or the second latching circuit 323 through the sensing node SO.

The first inverter IN1 and the second inverter IN2 are coupled between the node QA and a node QAb as a first latch circuit L1.

The sixth N-MOS transistor N6 is coupled between the node QAb and a fourth node 4, and operates in accordance with a control signal READA for reading the data stored in the first latching circuit 322.

The seventh N-MOS transistor N7 is coupled between the node QA and the fourth node 4, and operates in accordance with an inverse signal READA_N of the control signal READA.

The eighth N-MOS transistor N8 is coupled between the fourth node 4 and a ground voltage, and operates in accordance with a voltage level of the sensing node SO.

The ninth N-MOS transistor N9 is coupled between the node QA and a fifth node 5 as mentioned above, and operates in accordance with a control signal PBDO for outputting the data stored in the first latching circuit 322.

The tenth N-MOS transistor N10 is coupled between the sensing node SO and the node QB, and operates in accordance with a control signal TRANB, thereby transmitting data in the second latching circuit 323 to the bit line or the first latching circuit 322 through the sensing node SO.

The eleventh N-MOS transistor N11 is coupled between the node QB and the ground voltage, and operates in accordance with a reset signal RESETB.

The twelfth N-MOS transistor N12 is coupled between the sensing node SO and a node QBb, and operates in accordance with an inverse signal TRANB_N of the control signal TRANB inputted to the tenth N-MOS transistor N10.

The program operation is performed using the tenth N-MOS transistor N10 and the twelfth N-MOS transistor N12, and so data '1' is converted into data '0' or data '0' is converted into data '1'.

The tenth N-MOS transistor N10 or the twelfth N-MOS transistor N12 is turned on in accordance with a verifying voltage, and thus data '1' is converted into data '0', or data '0' is converted into data '1'. In addition, data '1' may be maintained or a width of the threshold voltage distribution may be reduced through the programming.

In one example embodiment of the present invention, the twelfth N-MOS transistor N12 is turned on when data '1' is converted into data '0' through the programming, and the tenth N-MOS transistor N10 is turned on when data '0' is converted into data '1' through the programming. In addition, the tenth N-MOS transistor N10 is turned on when data '1' is maintained, wherein the width of the threshold voltage distribution is reduced while data '1' is maintained. This will be described in detail in the following method of programming.

The third inverter IN3 and the fourth inverter IN4 are coupled between the node QB and the node QBb as a second latch circuit L2.

The thirteenth N-MOS transistor N13 and the fourteenth N-MOS transistor N14 are coupled in serial between the node QBb and the ground voltage. The thirteenth N-MOS transistor N13 operates in accordance with the voltage level of the sensing node SO, and the fourteenth N-MOS transistor N14 operates in accordance with a read control signal READB of the second latching circuit 323.

The fifteenth N-MOS transistor N15 is coupled between the node QB and the fifth node 5, and operates in accordance with an input control signal nDI.

The sixteenth N-MOS transistor N16 and the seventeenth N-MOS transistor N17 are coupled in serial between the node QBb and a data line DL. The fifth node serves as a couple point of the sixteenth N-MOS transistor N16 and the seventeenth N-MOS transistor N17.

The sixteenth N-MOS transistor N16 operates in accordance with a data input control signal DI, and the seventeenth N-MOS transistor N17 operates in accordance with an input address control signal YADRV.

The first latching circuit 322 operates for the program and the verifying of data, and the second latching circuit 323 operates for input and verifying of data. Accordingly, the program operation is generally performed by loading data to the second latching circuit 323 and transmitting the loaded data to the first latching circuit 322.

Hereinafter, the read operation in the memory device having an MLC for storing 4 bits will be described in detail with reference to the accompanying drawings.

Figure 4A:
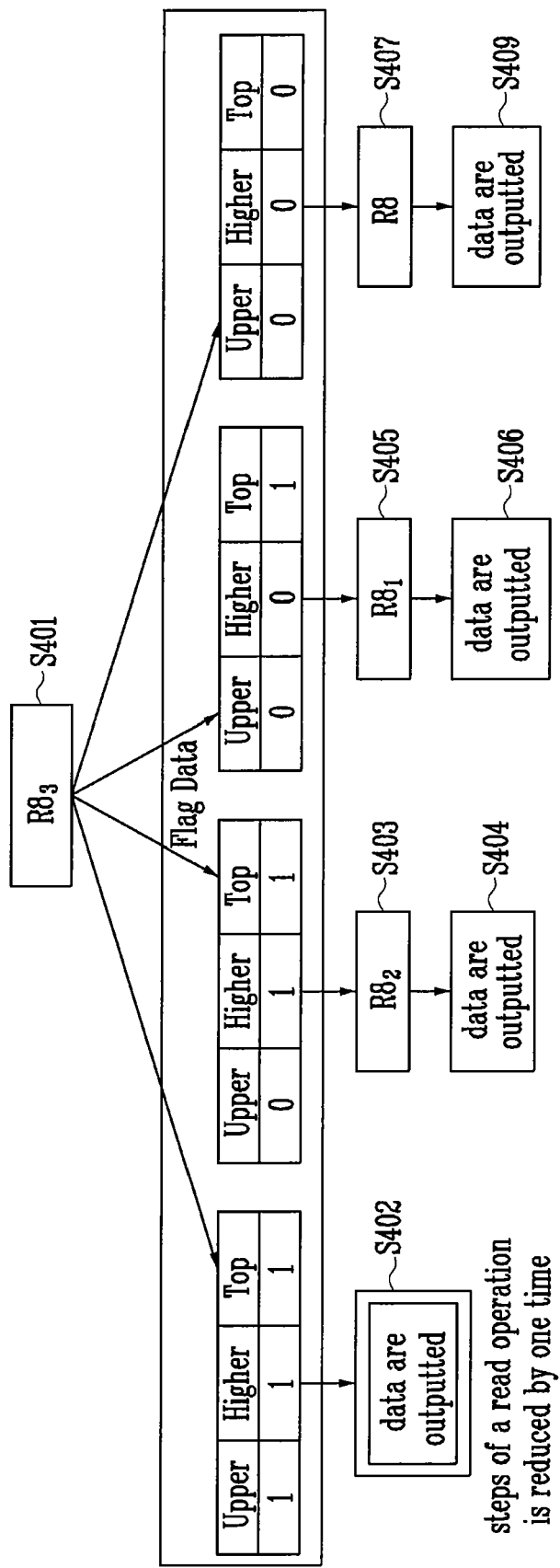
Figure 4B:
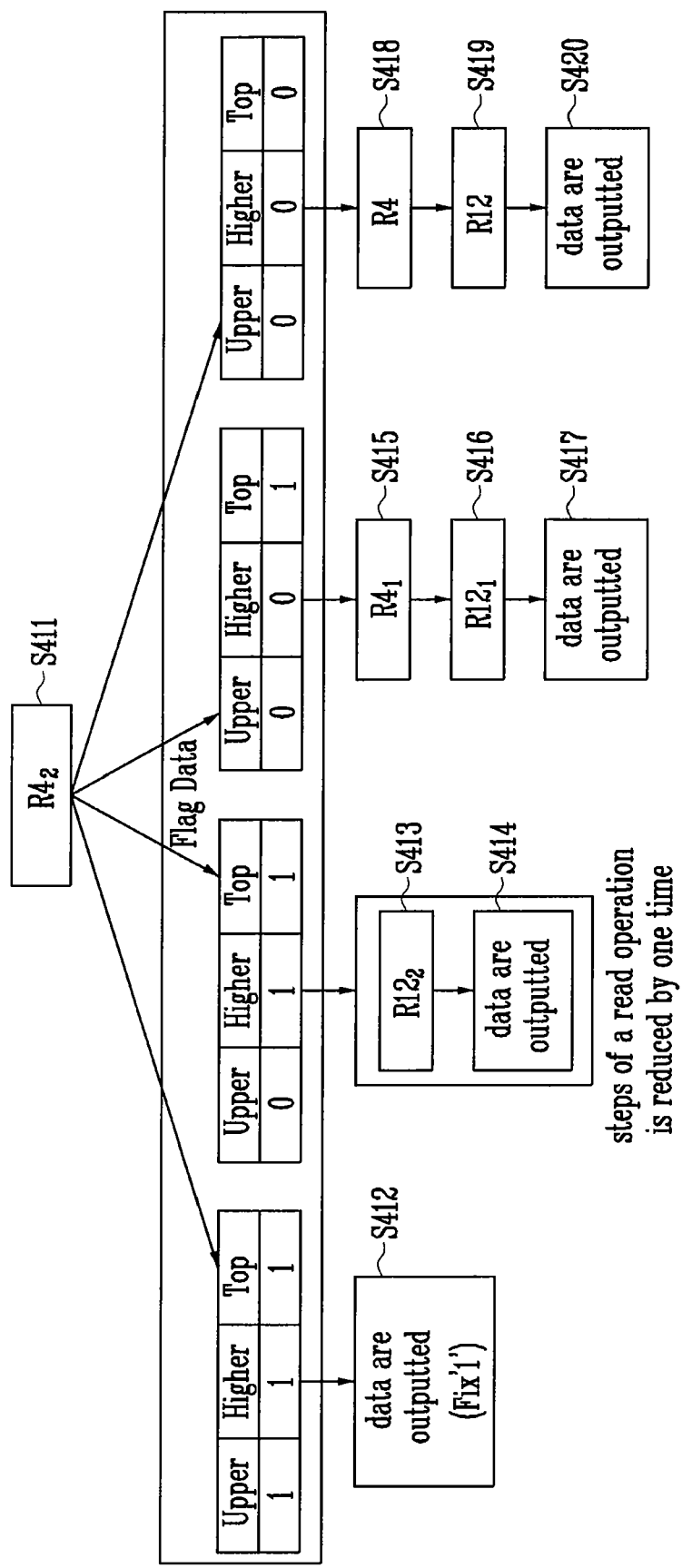

FIG. 4A to FIG. 4D illustrate a read operation of the memory device according to one example embodiment of the present invention. Particularly, FIG. 4A shows a read operation of the first bit Lower, and FIG. 4B illustrates a read operation of the second bit Upper. FIG. 4C shows a read operation of the third bit Higher, and FIG. 4D illustrates a read operation of the fourth bit Top. Furthermore, FIG. 2 is also referred to when describing the read operation.

In FIG. 4A, a read voltage $R8_3$ is applied to a word line selected for reading the first bit Lower in step S401.

In step S402, data are read in accordance with the read voltage $R8_3$ when every flag cell, e.g. three flag cells, is not programmed. That is, when each of the first flag cell indicating a program of the second bit Upper, the second flag cell indicating a program of the third bit Higher and the third flag cell indicating a program of the fourth bit Top is '1', i.e. is erased, the data are read by the read voltage $R8_3$ set in the step S401.

However, when the flag cells indicating a program of the second bit Lower to the fourth bit Top have [011] the read operation is performed using a read voltage $R8_2$ in step S403, and data are output in step S404.

In addition, when the flag cells have [001], data are read using a read voltage $R8_1$ in steps S405 and S406.

In step S407, when the flag cells have [000], data are read using a read voltage R8. Here, the read voltage $R8_3$ is used initially for the read operation, but other read voltages $R8_1$ or R8 may be used for the initial read operation because the read voltage used initially is a voltage for reading the flag cell. However, when the read operation is initiated with the read voltage $PV8_3$ in step S401, the first bit Lower may be read by reading the flag cell. Accordingly, steps for the read operation may be reduced by one step.

Node state of the page buffer related to read of the first bit Lower will be shown with reference to Table 1.

TABLE 1

| CASE | BL | | SO | | QA | | QB | |
|---|---|---|---|---|---|---|---|---|
| | $A_3$ | $B_3$ | $A_3$ | $B_3$ | $A_3$ | $B_3$ | $A_3$ | $B_3$ |
| High-Set QB | | | 1 | 1 | | | 1 | 1 |
| RESET QA | | | 1 | 1 | 0 | 0 | | |
| Inverse $R8_3$ to QB | 0 | 1 | 0 | 1 | | | 1 | 0 |
| Data transfer QB to QA | | | | | 1 | 0 | 1 | 0 |
| Data out from QA & Cache read to QB | | | | | | | | |

As shown in Table 1, when the node QB of the second latching circuit 323 is set, i.e. High-set, the sensing node SO has high level '1' in the case of A3 and B3, and the node QB has high level '1' in the case of A3 and B3. To perform this operation, the first P-MOS transistor P1 is turned on, and so the sensing node SO is precharged. In addition, the fourteenth N-MOS transistor N14 is turned on, and the node QBb and the node QB have '0' and '1', respectively.

Subsequently, the node QA of the first latching circuit 322 is reset, and so the node QA has '0'. Particularly, the seventh N-MOS transistor N7 is turned on when the sensing node SO is precharged, and thus the node QA has '0'.

Data of a selected memory cell are inverted, and then the inverted data are transmitted to the node QB in accordance with the read voltage $R8_3$. The bit line has '0', i.e. low level in accordance with the read result in the case of A3, and has '1', i.e. high level in the case of B3. The node QB has data opposed to data of the bit line. That is, the node QB has '1' in the case of A3, and has '0' in the case of QB. (Inverse $R8_3$ to QB)

The data of the node QB is transmitted to the node QA (Data transfer QB to QA) to output the read data. The data of the node QA is output through the Y decoder 340, and the data of the node QB is stored as it is (Data out from QA & Cache read to QB). Cache read means that data may be read through the latch (node QB) while the data in the latch that is different from the latch corresponding to the node QB is output. Since the Cache read operation is a well-known technique and is not necessarily required for embodying the present invention, any further description concerning the Cache read operation is omitted.

Node state of the page buffer related to a read of the first bit Lower when the first bit Lower and the second bit Upper are programmed will be shown with reference to Table 2.

TABLE 2

| CASE | BL | | | | SO | | | | QA | | | | QB | | | |
|---|---|---|---|---|---|---|---|---|---|---|---|---|---|---|---|---|
| | $A_2$ | $B_2$ | $C_2$ | $D_2$ | $A_2$ | $B_2$ | $C_2$ | $D_2$ | $A_2$ | $B_2$ | $C_2$ | $D_2$ | $A_2$ | $B_2$ | $C_2$ | $D_2$ |
| High-Set QB | | | | | 1 | 1 | 1 | 1 | | | | | 1 | 1 | 1 | 1 |
| RESET QA | | | | | 1 | 1 | 1 | 1 | 0 | 0 | 0 | 0 | | | | |
| Inverse $R8_3$ to QB | | | | | | | | | | | | | | | | |
| High-Set QB | | | | | 1 | 1 | 1 | 1 | | | | | 1 | 1 | 1 | 1 |
| Inverse $R8_2$ to QB | 0 | 0 | 1 | 1 | 0 | 0 | 1 | 1 | | | | | 1 | 1 | 0 | 0 |
| Data trasfer QB to QA | | | | | 1 | 1 | 0 | 0 | 1 | 1 | 0 | 0 | | | | |
| Data out from QA & Cashe read to QB | | | | | | | | | | | | | | | | |

Node state of the page buffer related to read of the first bit Lower when the first bit Lower to the third bit Higher are programmed is shown with reference to Table 3.

TABLE 3

| CASE | BL | | | | | | | | SO | | | | | | | |
|---|---|---|---|---|---|---|---|---|---|---|---|---|---|---|---|---|
| | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | | | | | | | | | 1 | 1 | 1 | 1 | 1 | 1 | 1 | 1 |
| Inverse $R8_3$ | | | | | | | | | | | | | | | | |
| High-Set QB | | | | | | | | | 1 | 1 | 1 | 1 | 1 | 1 | 1 | 1 |
| Inverse $R8_1$ to QB | 0 | 0 | 0 | 0 | 1 | 1 | 1 | 1 | 0 | 0 | 0 | 0 | 1 | 1 | 1 | 1 |
| Data trasfer QB to QA | | | | | | | | | 1 | 1 | 1 | 1 | 0 | 0 | 0 | 0 |
| Data out from QA & Cashe read to QB | | | | | | | | | | | | | | | | |

| CASE | QA | | | | | | | | QB | | | | | | | |
|---|---|---|---|---|---|---|---|---|---|---|---|---|---|---|---|---|
| | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | 0 | 0 | 0 | 0 | 0 | 0 | 0 | 0 | | | | | | | | |
| Inverse $R8_3$ | | | | | | | | | | | | | | | | |
| High-Set QB | | | | | | | | | 1 | 1 | 1 | 1 | 1 | 1 | 1 | 1 |
| Inverse $R8_1$ to QB | | | | | | | | | 1 | 1 | 1 | 1 | 0 | 0 | 0 | 0 |
| Data trasfer QB to QA | 1 | 1 | 1 | 1 | 0 | 0 | 0 | 0 | | | | | | | | |
| Data out from QA & Cashe read to QB | | | | | | | | | | | | | | | | |

Node state of the page buffer related to read of the first bit Lower when the first bit Lower to the fourth bit Top are programmed is shown with reference to Table 4.

TABLE 4

| CASE | BL | | | | | | | | | | | | | | | | SO | | | | | | | |
|---|---|---|---|---|---|---|---|---|---|---|---|---|---|---|---|---|---|---|---|---|---|---|---|---|
| | A | B | C | D | E | F | G | H | I | J | K | L | M | N | O | P | A | B | C | D | E | F | G | H |
| High-Set QB | | | | | | | | | | | | | | | | | 1 | 1 | 1 | 1 | 1 | 1 | 1 | 1 |
| RESET QA | | | | | | | | | | | | | | | | | 1 | 1 | 1 | 1 | 1 | 1 | 1 | 1 |
| Inverse $R8_3$ | | | | | | | | | | | | | | | | | | | | | | | | |
| High-Set QB | | | | | | | | | | | | | | | | | 1 | 1 | 1 | 1 | 1 | 1 | 1 | 1 |
| Inverse R8 to QB | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| Data trasfer QB to QA | | | | | | | | | | | | | | | | | 1 | 1 | 1 | 1 | 1 | 1 | 1 | 1 |
| Data out from QA & Cashe read to QB | | | | | | | | | | | | | | | | | | | | | | | | |

TABLE 4-continued

|  | SO | | | | | | | | QA | | | | | | | | | | | | | | | |
| --- | --- | --- | --- | --- | --- | --- | --- | --- | --- | --- | --- | --- | --- | --- | --- | --- | --- | --- | --- | --- | --- | --- | --- | --- |
| CASE | I | J | K | L | M | N | O | P | A | B | C | D | E | F | G | H | I | J | K | L | M | N | O | P |
| High-Set QB | 1 | 1 | 1 | 1 | 1 | 1 | 1 | 1 | | | | | | | | | | | | | | | | |
| RESET QA | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| Inverse R8$_3$ | | | | | | | | | | | | | | | | | | | | | | | | |
| High-Set QB | 1 | 1 | 1 | 1 | 1 | 1 | 1 | 1 | | | | | | | | | | | | | | | | |
| Inverse R8 to QB | 1 | 1 | 1 | 1 | 1 | 1 | 1 | 1 | | | | | | | | | | | | | | | | |
| Data trasfer QB to QA | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| Data out from QA & Cashe read to QB | | | | | | | | | | | | | | | | | | | | | | | | |

|  | QB | | | | | | | | | | | | | | | |
| --- | --- | --- | --- | --- | --- | --- | --- | --- | --- | --- | --- | --- | --- | --- | --- | --- |
| CASE | A | B | C | D | E | F | G | H | I | J | K | L | M | N | O | P |
| High-Set QB | 1 | 1 | 1 | 1 | 1 | 1 | 1 | 1 | 1 | 1 | 1 | 1 | 1 | 1 | 1 | 1 |
| RESET QA | | | | | | | | | | | | | | | | |
| Inverse R8$_3$ | | | | | | | | | | | | | | | | |
| High-Set QB | 1 | 1 | 1 | 1 | 1 | 1 | 1 | 1 | 1 | 1 | 1 | 1 | 1 | 1 | 1 | 1 |
| Inverse R8 to QB | 1 | 1 | 1 | 1 | 1 | 1 | 1 | 1 | 0 | 0 | 0 | 0 | 0 | 0 | 0 | 0 |
| Data trasfer QB to QA | | | | | | | | | | | | | | | | |
| Data out from QA & Cashe read to QB | | | | | | | | | | | | | | | | |

Operation of the page buffer in Table 2 to Table 4 is similar to that of Table 1.

Hereinafter, a read operation of the second bit Upper will be described in detail with reference to FIG. 4B.

In FIG. 4B, the read operation is started by the read voltage R4$_2$ in step S411, and the state of the flag cell is detected. When the flag cells have state [111], the second bit Upper is not programmed, and so preset data '1' is output in step S412. When the flag cells have state [011], data are read in accordance with the read voltage R12$_2$ in step S413, and the read data are output in step S414. In this case, since the read operation is started with the read voltage R4$_2$ in step S411, the second bit Upper may be read when reading the flag cell. Accordingly, steps for the read operation may be reduced by one step.

Node state of the page buffer will be shown with reference to the tables below. Table 5 shows node state of the page buffer related to a read of the second bit Upper when the first bit Lower and the second bit Upper are programmed.

When the flag cells have state [001], data are read in sequence in accordance with the read voltages R4$_1$ and R12$_1$ in steps S415 and S416, and then data corresponding to the second bit Upper are read and output in step S417.

When the flag cells have state [000], data are read in sequence in accordance with the read voltages R4 and R12 in steps S418 and S419, and then the read data are output in step S420.

Table 6 shows node state of the page buffer related to a read of the second bit Upper when the first bit Lower to the third bit Higher are programmed. Table 7 shows node state of the page buffer related to a read of the second bit Upper when the first bit Lower to the fourth bit Top are programmed.

TABLE 5

|  | BL | | | | SO | | | | QA | | | | QB | | | |
| --- | --- | --- | --- | --- | --- | --- | --- | --- | --- | --- | --- | --- | --- | --- | --- | --- |
| CASE | A$_2$ | B$_2$ | C$_2$ | D$_2$ | A$_2$ | B$_2$ | C$_2$ | D$_2$ | A$_2$ | B$_2$ | C$_2$ | D$_2$ | A$_2$ | B$_2$ | C$_2$ | D$_2$ |
| High-Set QB | | | | | 1 | 1 | 1 | 1 | | | | | 1 | 1 | 1 | 1 |
| RESET QA | | | | | 1 | 1 | 1 | 1 | 0 | 0 | 0 | 0 | | | | |
| Inverse R4$_2$ to QB | 0 | 1 | 1 | 1 | 0 | 1 | 1 | 1 | | | | | 1 | 0 | 0 | 0 |
| R12$_2$ to QB | 0 | 0 | 0 | 1 | 0 | 0 | 0 | 1 | | | | | 1 | 0 | 0 | 1 |
| Data trasfer QB to QA | | | | | 1 | 0 | 0 | 1 | 1 | 0 | 0 | 1 | | | | |
| Data out from QA & Cashe read to QB | | | | | | | | | | | | | | | | |

TABLE 6

| | BL | | | | | | | | SO | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | | | | | | | | | 1 | 1 | 1 | 1 | 1 | 1 | 1 | 1 |
| Inverse $R4_2$ to QB | | | | | | | | | | | | | | | | |
| High-Set QB | | | | | | | | | 1 | 1 | 1 | 1 | 1 | 1 | 1 | 1 |
| Inverse $R4_1$ to QB | 0 | 0 | 1 | 1 | 1 | 1 | 1 | 1 | 0 | 0 | 1 | 1 | 1 | 1 | 1 | 1 |
| $R12_1$ to QB | 0 | 0 | 0 | 0 | 0 | 0 | 1 | 1 | 0 | 0 | 0 | 0 | 0 | 0 | 1 | 1 |
| Data trasfer QB to QA | | | | | | | | | 1 | 1 | 0 | 0 | 0 | 0 | 0 | 0 |
| Data out from QA & Cashe read to QB | | | | | | | | | | | | | | | | |

| | QA | | | | | | | | QB | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | 0 | 0 | 0 | 0 | 0 | 0 | 0 | 0 | | | | | | | | |
| Inverse $R4_2$ to QB | | | | | | | | | | | | | | | | |
| High-Set QB | | | | | | | | | 1 | 1 | 1 | 1 | 1 | 1 | 1 | 1 |
| Inverse $R4_1$ to QB | | | | | | | | | 1 | 1 | 0 | 0 | 0 | 0 | 0 | 0 |
| $R12_1$ to QB | | | | | | | | | 1 | 1 | 0 | 0 | 0 | 0 | 1 | 1 |
| Data trasfer QB to QA | 1 | 1 | 0 | 0 | 0 | 0 | 1 | 1 | | | | | | | | |
| Data out from QA & Cashe read to QB | | | | | | | | | | | | | | | | |

TABLE 7

| | BL | | | | | | | | | | | | | | | | SO | | | | | | | |
|---|---|---|---|---|---|---|---|---|---|---|---|---|---|---|---|---|---|---|---|---|---|---|---|---|
| CASE | A | B | C | D | E | F | G | H | I | J | K | L | M | N | O | P | A | B | C | D | E | F | G | H |
| High-Set QB | | | | | | | | | | | | | | | | | 1 | 1 | 1 | 1 | 1 | 1 | 1 | 1 |
| RESET QA | | | | | | | | | | | | | | | | | 1 | 1 | 1 | 1 | 1 | 1 | 1 | 1 |
| Inverse $R4_2$ to QB | | | | | | | | | | | | | | | | | | | | | | | | |
| High-Set QB | | | | | | | | | | | | | | | | | 1 | 1 | 1 | 1 | 1 | 1 | 1 | 1 |
| Inverse R4 to QB | 0 | 0 | 0 | 0 | 1 | 1 | 1 | 1 | 1 | 1 | 1 | 1 | 1 | 1 | 1 | 1 | 0 | 0 | 0 | 0 | 1 | 1 | 1 | 1 |
| R12 to QB | 0 | 0 | 0 | 0 | 0 | 0 | 0 | 0 | 0 | 0 | 0 | 0 | 1 | 1 | 1 | 1 | 0 | 0 | 0 | 0 | 0 | 0 | 0 | 0 |
| Data trasfer QB to QA | | | | | | | | | | | | | | | | | 1 | 1 | 1 | 1 | 0 | 0 | 0 | 0 |
| Data out from QA & Cashe read to QB | | | | | | | | | | | | | | | | | | | | | | | | |

| | SO | | | | | | | | QA | | | | | | | | | | | | | | | |
|---|---|---|---|---|---|---|---|---|---|---|---|---|---|---|---|---|---|---|---|---|---|---|---|---|
| CASE | I | J | K | L | M | N | O | P | A | B | C | D | E | F | G | H | I | J | K | L | M | N | O | P |
| High-Set QB | 1 | 1 | 1 | 1 | 1 | 1 | 1 | 1 | | | | | | | | | | | | | | | | |
| RESET QA | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| Inverse $R4_2$ to QB | | | | | | | | | | | | | | | | | | | | | | | | |
| High-Set QB | 1 | 1 | 1 | 1 | 1 | 1 | 1 | 1 | | | | | | | | | | | | | | | | |
| Inverse R4 to QB | 1 | 1 | 1 | 1 | 1 | 1 | 1 | 1 | | | | | | | | | | | | | | | | |
| R12 to QB | 0 | 0 | 0 | 0 | 1 | 1 | 1 | 1 | | | | | | | | | | | | | | | | |
| Data trasfer QB to QA | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 |
| Data out from QA & Cashe read to QB | | | | | | | | | | | | | | | | | | | | | | | | |

| | QB | | | | | | | | | | | | | | | |
|---|---|---|---|---|---|---|---|---|---|---|---|---|---|---|---|---|
| CASE | A | B | C | D | E | F | G | H | I | J | K | L | M | N | O | P |
| High-Set QB | 1 | 1 | 1 | 1 | 1 | 1 | 1 | 1 | 1 | 1 | 1 | 1 | 1 | 1 | 1 | 1 |
| RESET QA | | | | | | | | | | | | | | | | |
| Inverse $R4_2$ to QB | | | | | | | | | | | | | | | | |
| High-Set QB | 1 | 1 | 1 | 1 | 1 | 1 | 1 | 1 | 1 | 1 | 1 | 1 | 1 | 1 | 1 | 1 |
| Inverse R4 to QB | 1 | 1 | 1 | 1 | 0 | 0 | 0 | 0 | 0 | 0 | 0 | 0 | 0 | 0 | 0 | 0 |
| R12 to QB | 1 | 1 | 1 | 1 | 0 | 0 | 0 | 0 | 0 | 0 | 0 | 0 | 1 | 1 | 1 | 1 |
| Data trasfer QB to QA | | | | | | | | | | | | | | | | |
| Data out from QA & Cashe read to QB | | | | | | | | | | | | | | | | |

Hereinafter, a read operation of the third bit Higher will be described in detail with reference to FIG. 4C.

The read operation is performed in accordance with the read voltage $R2_1$ in step S421, and then a state of the flag cells is detected. When the flag cells have state [111], data '1' are output in step S422. When the flag cells have state [011], data '1' are output in step S423.

When the flag cells have state [001], data are read in sequence in accordance with the read voltages $R6_1$, $R10_1$ and $R14_1$ in steps S424 to S426, and then the read data are output in step S427. When the flag cells have state [000], data are read in sequence in accordance with the read voltages R2, R6, R10 and R14 in steps S428 to S431, and then the read data are output in step S432.

Table 8 shows node state of the page buffer related to read of the third bit Higher when the first bit Lower to the third bit Higher are programmed.

TABLE 8

| CASE | BL | | | | | | | | SO | | | | | | | |
|---|---|---|---|---|---|---|---|---|---|---|---|---|---|---|---|---|
| | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | | | | | | | | | 1 | 1 | 1 | 1 | 1 | 1 | 1 | 1 |
| Inverse $R2_1$ to QB | 0 | 1 | 1 | 1 | 1 | 1 | 1 | 1 | 0 | 1 | 1 | 1 | 1 | 1 | 1 | 1 |
| $R6_1$ to QB | 0 | 0 | 0 | 1 | 1 | 1 | 1 | 1 | 0 | 0 | 0 | 1 | 1 | 1 | 1 | 1 |
| Inverse $R10_1$ to QB | 0 | 0 | 0 | 0 | 0 | 1 | 1 | 1 | 0 | 0 | 0 | 0 | 0 | 1 | 1 | 1 |
| $R14_1$ to QB | 0 | 0 | 0 | 0 | 0 | 0 | 0 | 1 | 0 | 0 | 0 | 0 | 0 | 0 | 0 | 1 |
| Data trasfer QB to QA | | | | | | | | | 1 | 0 | 0 | 1 | 1 | 0 | 0 | 1 |
| Data out from QA & Cashe read to QB | | | | | | | | | | | | | | | | |

| CASE | QA | | | | | | | | QB | | | | | | | |
|---|---|---|---|---|---|---|---|---|---|---|---|---|---|---|---|---|
| | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| High-Set QB | | | | | | | | | 1 | 1 | 1 | 1 | 1 | 1 | 1 | 1 |
| RESET QA | 0 | 0 | 0 | 0 | 0 | 0 | 0 | 0 | | | | | | | | |
| Inverse $R2_1$ to QB | | | | | | | | | 1 | 0 | 0 | 0 | 0 | 0 | 0 | 0 |
| $R6_1$ to QB | | | | | | | | | 1 | 0 | 0 | 1 | 1 | 1 | 1 | 1 |
| Inverse $R10_1$ to QB | | | | | | | | | 1 | 0 | 0 | 1 | 1 | 0 | 0 | 0 |
| $R14_1$ to QB | | | | | | | | | 1 | 0 | 0 | 1 | 1 | 0 | 0 | 1 |
| Data trasfer QB to QA | 1 | 0 | 0 | 1 | 1 | 0 | 0 | 1 | | | | | | | | |
| Data out from QA & Cashe read to QB | | | | | | | | | | | | | | | | |

Since the read operation is started with the read voltage $R2_1$ in step S421, steps for the read operation may be reduced by one step as the steps S424 to S427.

Table 9 shows node state of the page buffer related to read of the third bit Higher when the first bit Lower to the fourth bit Top are programmed.

TABLE 9

| CASE | BL | | | | | | | | | | | | | | | | SO | | | | | | | |
|---|---|---|---|---|---|---|---|---|---|---|---|---|---|---|---|---|---|---|---|---|---|---|---|---|
| | A | B | C | D | E | F | G | H | I | J | K | L | M | N | O | P | A | B | C | D | E | F | G | H |
| High-Set QB | | | | | | | | | | | | | | | | | 1 | 1 | 1 | 1 | 1 | 1 | 1 | 1 |
| RESET QA | | | | | | | | | | | | | | | | | 1 | 1 | 1 | 1 | 1 | 1 | 1 | 1 |
| Inverse $R2_1$ to QB | | | | | | | | | | | | | | | | | | | | | | | | |
| High-Set QB | | | | | | | | | | | | | | | | | 1 | 1 | 1 | 1 | 1 | 1 | 1 | 1 |
| Inverse R2 to QB | 0 | 0 | 1 | 1 | 1 | 1 | 1 | 1 | 1 | 1 | 1 | 1 | 1 | 1 | 1 | 1 | 0 | 0 | 1 | 1 | 1 | 1 | 1 | 1 |
| R6 to QB | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 1 | 1 |
| Inverse R10 to QB | 0 | 0 | 0 | 0 | 0 | 0 | 0 | 0 | 0 | 0 | 1 | 1 | 1 | 1 | 1 | 1 | 0 | 0 | 0 | 0 | 0 | 0 | 0 | 0 |
| R14 to QB | 0 | 0 | 0 | 0 | 0 | 0 | 0 | 0 | 0 | 0 | 0 | 0 | 0 | 0 | 1 | 1 | 0 | 0 | 0 | 0 | 0 | 0 | 0 | 0 |
| Data trasfer QB to QA | | | | | | | | | | | | | | | | | 1 | 1 | 0 | 0 | 0 | 0 | 1 | 1 |
| Data out from QA & Cashe read to QB | | | | | | | | | | | | | | | | | | | | | | | | |

| CASE | SO | | | | | | | | QA | | | | | | | | | | | | | | | |
|---|---|---|---|---|---|---|---|---|---|---|---|---|---|---|---|---|---|---|---|---|---|---|---|---|
| | I | J | K | L | M | N | O | P | A | B | C | D | E | F | G | H | I | J | K | L | M | N | O | P |
| High-Set QB | 1 | 1 | 1 | 1 | 1 | 1 | 1 | 1 | | | | | | | | | | | | | | | | |
| RESET QA | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| Inverse $R2_1$ to QB | | | | | | | | | | | | | | | | | | | | | | | | |
| High-Set QB | 1 | 1 | 1 | 1 | 1 | 1 | 1 | 1 | | | | | | | | | | | | | | | | |
| Inverse R2 to QB | 1 | 1 | 1 | 1 | 1 | 1 | 1 | 1 | | | | | | | | | | | | | | | | |
| R6 to QB | 1 | 1 | 1 | 1 | 1 | 1 | 1 | 1 | | | | | | | | | | | | | | | | |
| Inverse R10 to QB | 0 | 0 | 1 | 1 | 1 | 1 | 1 | 1 | | | | | | | | | | | | | | | | |

TABLE 9-continued

| | | | | | | | | | | | | | | | | | | | | | | | | |
|---|---|---|---|---|---|---|---|---|---|---|---|---|---|---|---|---|---|---|---|---|---|---|---|---|
| R14 to QB | 0 | 0 | 0 | 0 | 0 | 0 | 1 | 1 | | | | | | | | | | | | | | | | |
| Data trasfer QB to QA | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 |
| Data out from QA & Cashe read to QB | | | | | | | | | | | | | | | | | | | | | | | | |

| | | QB | | | | | | | | | | | | | | | |
|---|---|---|---|---|---|---|---|---|---|---|---|---|---|---|---|---|---|
| CASE | | A | B | C | D | E | F | G | H | I | J | K | L | M | N | O | P |
| High-Set QB | | 1 | 1 | 1 | 1 | 1 | 1 | 1 | 1 | 1 | 1 | 1 | 1 | 1 | 1 | 1 | 1 |
| RESET QA | | | | | | | | | | | | | | | | | |
| Inverse R2$_1$ to QB | | | | | | | | | | | | | | | | | |
| High-Set QB | | 1 | 1 | 1 | 1 | 1 | 1 | 1 | 1 | 1 | 1 | 1 | 1 | 1 | 1 | 1 | 1 |
| Inverse R2 to QB | | 1 | 1 | 0 | 0 | 0 | 0 | 0 | 0 | 0 | 0 | 0 | 0 | 0 | 0 | 0 | 0 |
| R6 to QB | | 1 | 1 | 0 | 0 | 0 | 0 | 1 | 1 | 1 | 1 | 1 | 1 | 1 | 1 | 1 | 1 |
| Inverse R10 to QB | | 1 | 1 | 0 | 0 | 0 | 0 | 1 | 1 | 1 | 1 | 0 | 0 | 0 | 0 | 0 | 0 |
| R14 to QB | | 1 | 1 | 0 | 0 | 0 | 0 | 1 | 1 | 1 | 1 | 0 | 0 | 0 | 0 | 1 | 1 |
| Data trasfer QB to QA | | | | | | | | | | | | | | | | | |
| Data out from QA & Cashe read to QB | | | | | | | | | | | | | | | | | |

Hereinafter, a read operation of the fourth bit Top will be described in detail with reference to FIG. 4D.

The state of the flag cells are detected by performing the read operation in accordance with the read voltage R1 in step S441. When the flag cells have state [111], [011] or [001], a read operation is not performed, and data '1' are output in steps S442 to S444.

When the flag cells have state [000], data are output in sequence in accordance with the read voltages R3, R5, R7, R9, R11, R13 and R15 in steps S445 to S451, and then the read data are output in step S452. In this case, since the read operation is started with the read voltage R1 in step S421, steps for the read operation may be reduced by one step.

Table 10 shows node state of the page buffer related to a read of the fourth bit Top when the first bit Lower to the fourth bit Top are programmed.

TABLE 10

| | BL | | | | | | | | | | | | | | | | SO | | | | | | | |
|---|---|---|---|---|---|---|---|---|---|---|---|---|---|---|---|---|---|---|---|---|---|---|---|---|
| CASE | A | B | C | D | E | F | G | H | I | J | K | L | M | N | O | P | A | B | C | D | E | F | G | H |
| High-Set QB | | | | | | | | | | | | | | | | | 1 | 1 | 1 | 1 | 1 | 1 | 1 | 1 |
| RESET QA | | | | | | | | | | | | | | | | | 1 | 1 | 1 | 1 | 1 | 1 | 1 | 1 |
| Inverse R1 to QB | 0 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 |
| R3 to QB | 0 | 0 | 0 | 1 | 1 | 1 | 1 | 1 | 1 | 1 | 1 | 1 | 1 | 1 | 1 | 1 | 0 | 0 | 0 | 1 | 1 | 1 | 1 | 1 |
| Inverse R5 to QB | 0 | 0 | 0 | 0 | 0 | 1 | 1 | 1 | 1 | 1 | 1 | 1 | 1 | 1 | 1 | 1 | 0 | 0 | 0 | 0 | 0 | 1 | 1 | 1 |
| R7 to QB | 0 | 0 | 0 | 0 | 0 | 0 | 0 | 1 | 1 | 1 | 1 | 1 | 1 | 1 | 1 | 1 | 0 | 0 | 0 | 0 | 0 | 0 | 0 | 1 |
| Inverse R9 to QB | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| R11 to QB | 0 | 0 | 0 | 0 | 0 | 0 | 0 | 0 | 0 | 0 | 1 | 1 | 1 | 1 | 1 | 1 | 0 | 0 | 0 | 0 | 0 | 0 | 0 | 0 |
| Inverse R13 to QB | 0 | 0 | 0 | 0 | 0 | 0 | 0 | 0 | 0 | 0 | 0 | 0 | 1 | 1 | 1 | 1 | 0 | 0 | 0 | 0 | 0 | 0 | 0 | 0 |
| R15 to QB | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| Data trasfer QB to QA | | | | | | | | | | | | | | | | | 1 | 0 | 0 | 1 | 1 | 0 | 0 | 1 |
| Data out from QA & Cashe read to QB | | | | | | | | | | | | | | | | | | | | | | | | |

| | SO | | | | | | | | QA | | | | | | | | | | | | | | | |
|---|---|---|---|---|---|---|---|---|---|---|---|---|---|---|---|---|---|---|---|---|---|---|---|---|
| CASE | I | J | K | L | M | N | O | P | A | B | C | D | E | F | G | H | I | J | K | L | M | N | O | P |
| High-Set QB | 1 | 1 | 1 | 1 | 1 | 1 | 1 | 1 | | | | | | | | | | | | | | | | |
| RESET QA | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| Inverse R1 to QB | 1 | 1 | 1 | 1 | 1 | 1 | 1 | 1 | | | | | | | | | | | | | | | | |
| R3 to QB | 1 | 1 | 1 | 1 | 1 | 1 | 1 | 1 | | | | | | | | | | | | | | | | |
| Inverse R5 to QB | 1 | 1 | 1 | 1 | 1 | 1 | 1 | 1 | | | | | | | | | | | | | | | | |
| R7 to QB | 1 | 1 | 1 | 1 | 1 | 1 | 1 | 1 | | | | | | | | | | | | | | | | |
| Inverse R9 to QB | 0 | 1 | 1 | 1 | 1 | 1 | 1 | 1 | | | | | | | | | | | | | | | | |
| R11 to QB | 0 | 0 | 0 | 1 | 1 | 1 | 1 | 1 | | | | | | | | | | | | | | | | |
| Inverse R13 to QB | 0 | 0 | 0 | 0 | 0 | 1 | 1 | 1 | | | | | | | | | | | | | | | | |
| R15 to QB | 0 | 0 | 0 | 0 | 0 | 0 | 0 | 1 | | | | | | | | | | | | | | | | |
| Data trasfer QB to QA | 1 | 0 | 0 | 1 | 1 | 1 | 0 | 1 | 1 | 0 | 0 | 1 | 1 | 0 | 0 | 1 | 1 | 0 | 0 | 1 | 1 | 1 | 0 | 1 |
| Data out from QA & Cashe read to QB | | | | | | | | | | | | | | | | | | | | | | | | | |

TABLE 10-continued

| | | QB | | | | | | | | | | | | | | | |
|---|---|---|---|---|---|---|---|---|---|---|---|---|---|---|---|---|---|
| | CASE | A | B | C | D | E | F | G | H | I | J | K | L | M | N | O | P |
| | High-Set QB | 1 | 1 | 1 | 1 | 1 | 1 | 1 | 1 | 1 | 1 | 1 | 1 | 1 | 1 | 1 | 1 |
| | RESET QA | | | | | | | | | | | | | | | | | |
| | Inverse R1 to QB | 1 | 0 | 0 | 0 | 0 | 0 | 0 | 0 | 0 | 0 | 0 | 0 | 0 | 0 | 0 | 0 |
| | R3 to QB | 1 | 0 | 0 | 1 | 1 | 1 | 1 | 1 | 1 | 1 | 1 | 1 | 1 | 1 | 1 | 1 |
| | Inverse R5 to QB | 1 | 0 | 0 | 1 | 1 | 0 | 0 | 0 | 0 | 0 | 0 | 0 | 0 | 0 | 0 | 0 |
| | R7 to QB | 1 | 0 | 0 | 1 | 1 | 0 | 0 | 1 | 1 | 1 | 1 | 1 | 1 | 1 | 1 | 1 |
| | Inverse R9 to QB | 1 | 0 | 0 | 1 | 1 | 0 | 0 | 1 | 1 | 0 | 0 | 0 | 0 | 0 | 0 | 0 |
| | R11 to QB | 1 | 0 | 0 | 1 | 1 | 0 | 0 | 1 | 1 | 0 | 0 | 1 | 1 | 1 | 1 | 1 |
| | Inverse R13 to QB | 1 | 0 | 0 | 1 | 1 | 0 | 0 | 1 | 1 | 0 | 0 | 1 | 1 | 0 | 0 | 0 |
| | R15 to QB | 1 | 0 | 0 | 1 | 1 | 0 | 0 | 1 | 1 | 0 | 0 | 1 | 1 | 1 | 0 | 1 |
| | Data trasfer QB to QA | | | | | | | | | | | | | | | | | |
| | Data out from QA & Cashe read to QB | | | | | | | | | | | | | | | | | |

Hereinafter, a method of programming the MLC in the memory device will be described in detail with reference to the accompanying drawings.

Figure 5A:
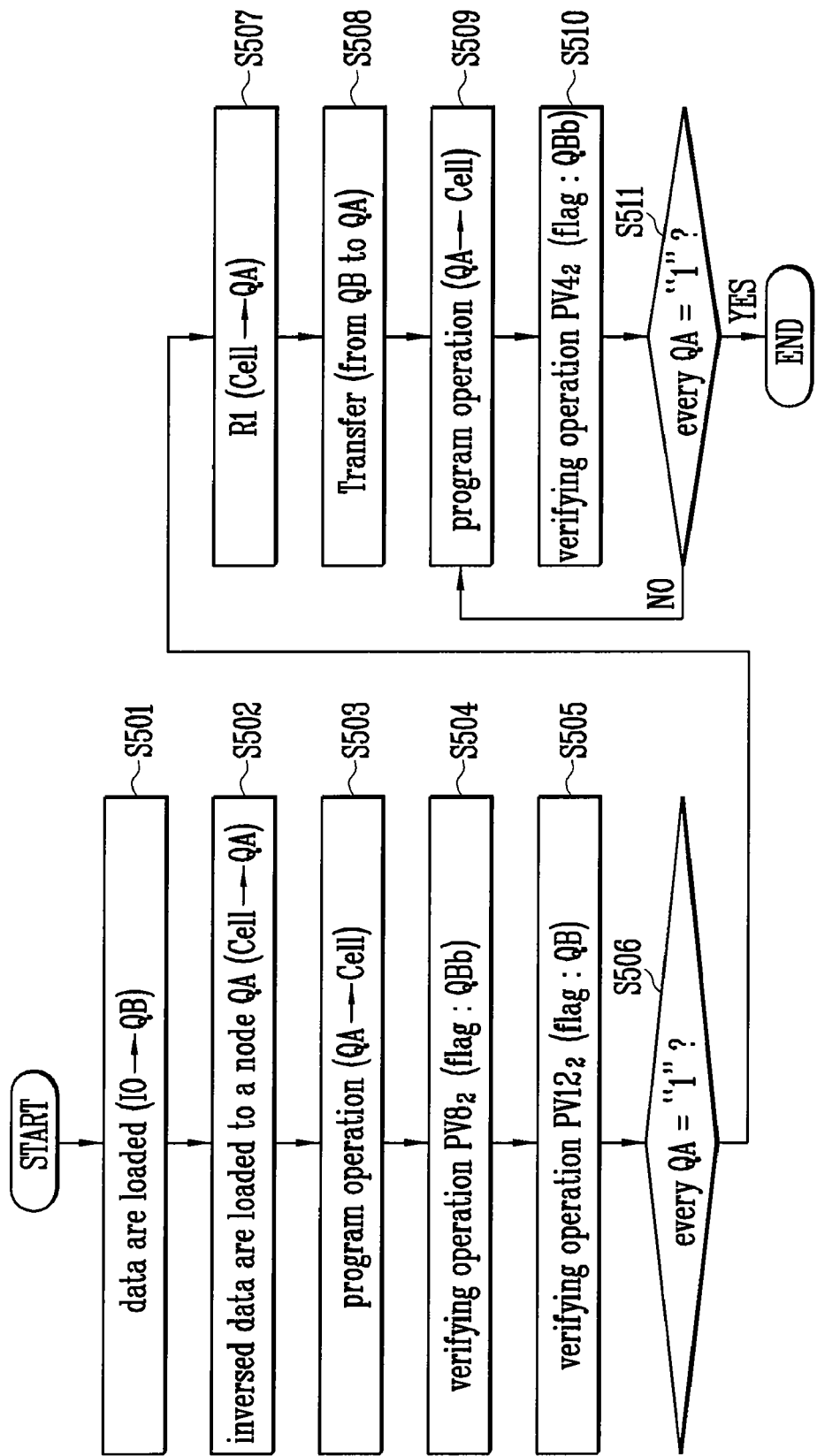
FIG. 5A to FIG. 5C are flow charts illustrating a process of programming data in the memory device according to one example embodiment of the present invention.
Figure 5B:
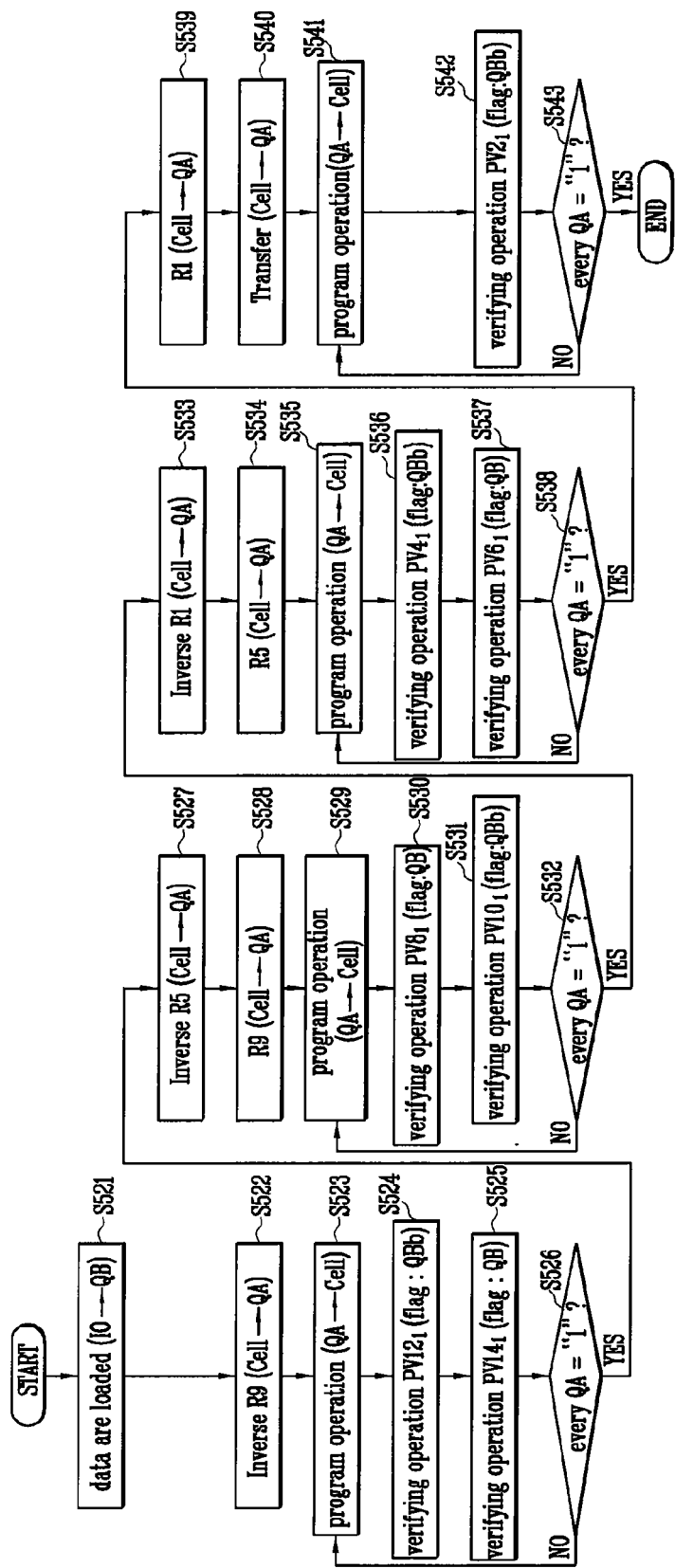
Figure 5C:
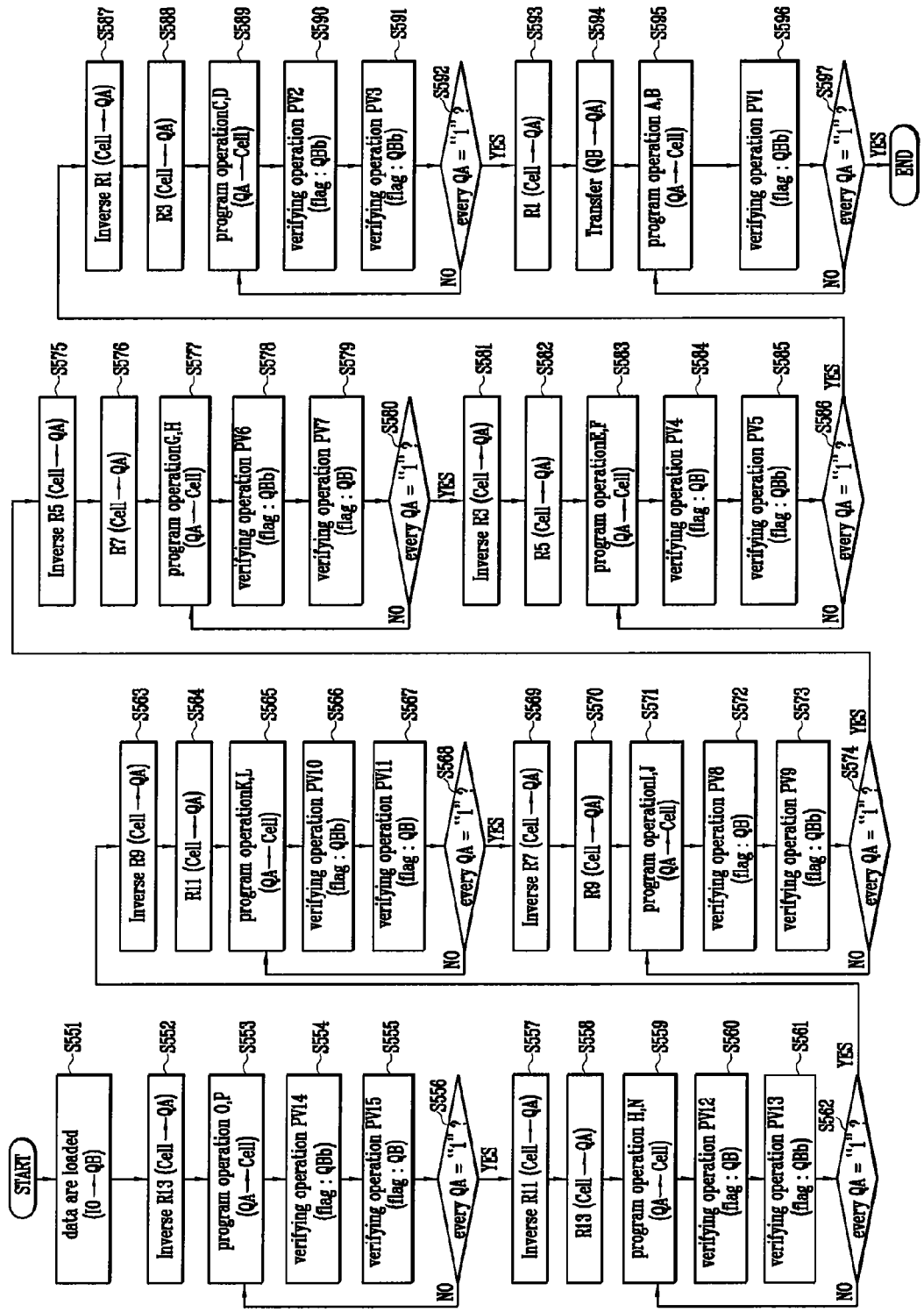

FIG. 5A to FIG. 5C are flow charts illustrating a process of programming data in the memory device according to one example embodiment of the present invention. Particularly, FIG. 5A is a flow chart illustrating a process of programming the second bit Upper. FIG. 5B is a flow chart illustrating a process of programming the third bit Higher. FIG. 5C is a flow chart illustrating a process of programming the fourth bit Top.

The operation of programming the memory device will also be described in detail with reference to FIG. 2 and FIG. 3B.

Hereinafter, a method of programming the first bit Lower in the memory device having the MLC for storing four bits will be described in detail with reference to Table 11.

TABLE 11

| $A_3$, $B_3$ State | BL | | SO | | QA | | QB | |
|---|---|---|---|---|---|---|---|---|
| CASE | $A_3$ | $B_3$ | $A_3$ | $B_3$ | $A_3$ | $B_3$ | $A_3$ | $B_3$ |
| Data Input(to QB) | | | | | | | L | L | H | L |
| Data Transfer (from QB to QA) | | | H | L | H | L | H | L |
| Program A, B | H | L | H | L | H | L | H | L |
| Verify $PV8_3$ (QBb flag: TRANB_N on) | H | L/H | H | L/H | H | L/H | | |

In Table 11, data are loaded to the node QB of the second latching circuit 323 (Data Input to QB). When data corresponding to the first bit Lower is '1', the node QB has high level H. However, when data corresponding to the first bit Lower is '0', the node QB has low level L. The data are loaded to the node QB through the Y decoder 340. For example, the eleventh N-MOS transistor N11 in FIG. 3B is turned on, and so the node QB has a low level.

The data loaded to the node QB are transmitted to the node QA (Data Transfer form QB to QA), and the transmitted data are programmed to a selected memory cell (Program, A3, B3).

Subsequently, a verifying operation is performed using the verifying voltage $PV8_3$ after the program operation is performed (Verify $PV8_3$ (QBb flag; TRANB_N on). In this case, since data '1' are converted into data '0', the control signal TRANB_N for turning on the twelfth N-MOS transistor N12 is transmitted to the twelfth N-MOS transistor N12.

The program of the second bit Upper is performed as shown in FIG. 5A and Table 12 after the first bit Lower is programmed.

TABLE 12

| $C_2$, $D_2$ & $A_2$, $B_2$ State | BL | | | | SO | | | | QA | | | | QB | | | |
|---|---|---|---|---|---|---|---|---|---|---|---|---|---|---|---|---|
| CASE | $A_2$ | $B_2$ | $C_2$ | $D_2$ | $A_2$ | $B_2$ | $C_2$ | $D_2$ | $A_2$ | $B_2$ | $C_2$ | $D_2$ | $A_2$ | $B_2$ | $C_2$ | $D_2$ |
| Data Input(to QB) | | | | | | | | | | | | | H | L | L | H |
| Inverse R1(to QA) READ_N on | L | L | H | H | L | L | H | H | H | H | L | L | | | | |
| Program | H | H | L | L | H | H | L | L | H | H | L | L | H | L | L | H |
| Verify $PV8_2$(QBb flag: TRANB_N on) | L | L | L/H | L | L | L | L/H | L | H | H | L/H | L | | | | |
| Verify $PV12_2$(QB flag: TRANB on) | L | L | L | L/H | L | L | L | L/H | H | H | H | L/H | | | | |
| R1(to QA) | L | L | H | H | L | L | H | H | L | L | H | H | | | | |
| Transfer(QB to QA) | | | | | | | | | H | L | H | H | | | | |
| Program | H | L | H | H | H | L | H | H | H | L | H | H | | | | |
| Verify $PV4_2$(QBb flag: TRANB_N on) | L | L/H | H | H | L | L/H | H | H | H | L/H | H | H | | | | |

In FIG. 5A and Table 12, data corresponding to the second bit Upper are loaded to the node QB (Data Input to QB) in step S501. It is assumed that every second bit Upper has '1' in the threshold voltage distribution of FIG. 2B when the program of the first bit Lower is finished.

Data corresponding to the first bit Lower in a selected memory cell are read in accordance with the read voltage R1, the read data are inverted, and then the inverted data are transmitted to the node QA in the first latching circuit 322 (Inverse R1 to QA READA_N on) in step S502.

In step S503, the program operation is performed on the data of the node QA.

In steps S504 and S505, a verifying operation for verifying the program operation is performed using the verifying voltages $PV8_2$ and $PV12_2$. The verifying operation using the verifying voltage $PV8_2$ is performed by turning on the twelfth N-MOS transistor N12. In addition, the verifying operation using the verifying voltage $PV12_2$ is performed by turning on the tenth N-MOS transistor N10. Particularly, since the verifying voltage $PV8_2$ is a voltage for verifying the program operation in which data corresponding to the second bit Upper is converted from '1' into '0' as shown in FIG. 2B, the twelfth N-MOS transistor N12 is turned on. Additionally, since the verifying voltage $PV12_2$ is a voltage for verifying the program operation in which data are converted into '0' in step C2 and the second bit Upper is again converted into '1', the tenth N-MOS transistor N10 is turned on.

Since the verifying voltage $PV4_2$ is a voltage for verifying the program operation in which data corresponding to the second bit Upper are converted from '1' into '0', the twelfth N-MOS transistor N12 is turned on.

In short, the tenth N-MOS transistor N10 is turned on in the process of verifying the program operation in which data '0' are converted into data '1', and the twelfth N-MOS transistor N12 is turned on in the process of verifying the program operation in which data '1' is converted into data '0'. Information associated with activation of the N-MOS transistor N10 or N12 is stored in the storing means 361 of the controller 360.

The program in steps C2 and D2 of FIG. 2B is performed in accordance with steps S502 to S505. Particularly, in case of the program in step C2, the twelfth N-MOS transistor N12 in FIG. 3B is turned on, and so the bit line is precharged when the node QBb has a high level.

The verifying operation is performed when every bit line is precharged. However, since every bit line is not precharged, the verifying operation has a fail state irrespective of state of the memory cell. Accordingly, the program operation is continuously performed until every bit line is precharged so as to perform steps C2 and D2. In case of the program in step D2, the tenth N-MOS transistor N10 is turned on so that the bit line is precharged in accordance with a voltage level of the node QB.

Every bit line is precharged by performing the steps S503 to S505, and so the node QA has a high level, i.e. '1'. In this case, the program in steps C2 and D2 is finished in step S506.

In step S507, the data in the memory cell are read to the node QA using the read voltage R1. Particularly, the data in the memory cell are normally read using the sixth N-MOS transistor N6.

The data in the node QB are transmitted to the node QA in accordance with the read data in step S508, and the program operation is performed in step S509.

In step S510, the verifying operation is performed using the verifying voltage $PV4_2$ after the program operation is performed.

In step S511, when the node QA has a high level, i.e. '1', the program operation is finished. In this case, the program operation in steps A2 and B2 is performed.

The program operation of the third bit Higher is performed as shown in FIG. 5B, Table 13 and Table 14 after the first bit Lower and the second bit Upper are programmed. Hereinafter, the third bit Higher is assumed to be '1' before the third bit Higher is programmed.

TABLE 13

| $G_1, H_1$ & $E_1, F_1$ State | BL | | | | | | | | SO | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| Data Input | | | | | | | | | | | | | | | | |
| Inverse R9 | L | L | L | L | L | L | H | H | L | L | L | L | L | L | H | H |
| Program $G_1, H_1$ | H | H | H | H | H | H | L | L | H | H | H | H | H | H | L | L |
| Verify $PV12_1$(QBb flag: TRANB_N on) | L | L | L | L | L | L | L/H | H | L | L | L | L | L | L | L/H | H |
| Verify $PV14_1$(QB flag: TRANB on) | L | L | L | L | L | L | L | L/H | L | L | L | L | L | L | L | L/H |
| Inverse R5 | L | L | L | L | H | H | H | H | L | L | L | L | H | H | H | H |
| R9 | L | L | L | L | L | L | H | H | L | L | L | L | L | L | H | H |
| Program $E_1, F_1$ | H | H | H | H | L | L | H | H | H | H | H | H | L | L | H | H |
| Verify $PV8_1$(QB flag: TRANB on) | L | L | L | L | L/H | H | H | H | L | L | L | L | L/H | H | H | H |
| Verify $PV10_1$(QBb flag: TRANB_N on) | L | L | L | L | L | L/H | H | H | L | L | L | L | L | L/H | H | H |

| $G_1, H_1$ & $E_1, F_1$ State | QA | | | | | | | | QB | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| Data Input | | | | | | | | | H | L | L | H | H | L | L | H |
| Inverse R9 | H | H | H | H | H | H | L | L | | | | | | | | |
| Program $G_1, H_1$ | H | H | H | H | H | H | L | L | | | | | | | | |
| Verify $PV12_1$(QBb flag: TRANB_N on) | H | H | H | H | H | H | L/H | L | | | | | | | | |
| Verify $PV14_1$(QB flag: TRANB on) | H | H | H | H | H | H | L/H | L/H | | | | | | | | |
| Inverse R5 | H | H | H | H | L | L | L | L | H | L | L | H | H | L | L | H |
| R9 | H | H | H | H | L | L | H | H | | | | | | | | |
| Program $E_1, F_1$ | H | H | H | H | L | L | H | H | | | | | | | | |
| Verify $PV8_1$(QB flag: TRANB on) | H | H | H | H | L/H | L | H | H | | | | | | | | |
| Verify $PV10_1$(QBb flag: TRANB_N on) | H | H | H | H | L/H | L/H | H | H | | | | | | | | |

TABLE 14

| $C_1, D_1$ & $A_1, B_1$ State | BL | | | | | | | | SO | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| Inverse R1 | L | L | H | H | H | H | H | H | L | L | H | H | H | H | H | H |
| R5 | L | L | L | L | H | H | H | H | L | L | L | L | H | H | H | H |
| Program $C_1, D_1$ | H | H | L | L | H | H | H | H | H | H | L | L | H | H | H | H |
| Verify $PV4_1$(QBb flag: TRANB_N on) | L | L | L/H | H | H | H | H | H | L | L | L/H | H | H | H | H | H |
| Verify $PV6_1$(QB flag: TRANB on) | L | L | L | L/H | H | H | H | H | L | L | L | L/H | H | H | H | H |
| R1 | L | L | H | H | H | H | H | H | L | L | H | H | H | H | H | H |
| Transf(QB to QA) | | | | | | | | | H | L | L | H | H | L | L | H |
| Program $A_1, B_1$ | H | L | H | H | H | H | H | H | H | L | H | H | H | H | H | H |
| Verify $PV2_1$(QBb flag: TRANB_N on) | L | L/H | H | H | H | H | H | H | L | L/H | H | H | H | H | H | H |

| $C_1, D_1$ & $A_1, B_1$ State | QA | | | | | | | | QB | | | | | | | |
|---|---|---|---|---|---|---|---|---|---|---|---|---|---|---|---|---|
| CASE | $A_1$ | $B_1$ | $C_1$ | $D_1$ | $E_1$ | $F_1$ | $G_1$ | $H_1$ | $A_1$ | $B_1$ | $C_1$ | $D_1$ | $E_1$ | $F_1$ | $G_1$ | $H_1$ |
| Inverse R1 | H | H | L | L | L | L | L | L | H | L | L | H | H | L | L | H |
| R5 | H | H | L | L | H | H | H | H | | | | | | | | |
| Program $C_1, D_1$ | H | H | L | L | H | H | H | H | | | | | | | | |
| Verify $PV4_1$(QBb flag: TRANB_N on) | H | H | L/H | L | H | H | H | H | | | | | | | | |
| Verify $PV6_1$(QB flag: TRANB on) | H | H | L/H | L/H | H | H | H | H | | | | | | | | |
| R1 | L | L | H | H | H | H | H | H | H | L | L | H | H | L | L | H |
| Transf(QB to QA) | H | L | H | H | H | H | H | H | | | | | | | | |
| Program $A_1, B_1$ | H | L | H | H | H | H | H | H | | | | | | | | |
| Verify $PV2_1$(QBb flag: TRANB_N on) | H | L/H | H | H | H | H | H | H | | | | | | | | |

In Table 13, Table 14 and FIG. 5B, data to be programmed as the third bit Higher are loaded to the node QB in step S521.

In step S522, data in the selected memory cell are inverted, and the inverted data are read to the node QA in accordance with the read voltage R9.

In step S523, the program in steps G1 and H1 is initially performed in FIG. 2C in accordance with the read operation in the step S522.

In step S525, the verifying operation is performed in accordance with the verifying voltages $PV12_1$ and $PV14_1$. Particularly, when the verifying operation is performed in accordance with the verifying voltage $PV12_1$, the twelfth N-MOS transistor N12 is turned on. When the verifying operation is performed in accordance with the verifying voltage $PV14_1$, the tenth N-MOS transistor N10 is turned on.

In step S526, when the node QA has '1' by the above program operation and the verifying operation, the program in the steps G1 and H1 is finished.

In step S527, to perform the program in steps E1 and F1, data in the memory cell are inverted, and the inverted data are read to the node QA in accordance with the read voltage R5.

In step S528, the data in the memory cell are read in accordance with the read voltage R9. As a result, only the memory cells related to step C2 are selectively programmed by steps S527 and S528.

In steps S529 to S531, the verifying operation is performed by the verifying voltages $PV8_1$ and $PV10_1$ after the data in the node QA are programmed.

In step S532, it is determined that the program in steps E1 and F1 is finished when every node QA has '1', and so the next data are programmed.

Subsequently, the program in steps C1 and D1 is performed as shown in Table 14. To perform the program, data in the memory cell are inverted, and then the inverted data are loaded to the node QA in accordance with the read voltage R1 in step S533. In addition, the data in the memory cell are loaded to the node QA in accordance with the read voltage R5 in step S534. This is for selecting the memory cells having the state in step B2.

In steps S534 to S537, the program operation is performed on the selected memory cells, and then the verifying operation is performed in accordance with the verifying voltages $PV4_1$ and $PV6_1$. The program in the steps C1 and D1 is finished when the program operation and the verifying operation are performed.

In step S539, data in the memory cell are loaded in the node QA in accordance with the read voltage R1 to perform the program in steps A1 and B1.

In steps S540 and S541, the data loaded to the node QB are transmitted to the node QA, and then the transmitted data are programmed.

In steps S542 and S543, it is verified whether or not the program is normally performed using the verifying voltage $PV2_1$. The program in steps A1 and B1 is finished when the program operation and the verifying operation are performed.

In the program of the third bit Higher, the twelfth N-MOS transistor N12 is turned on when the verifying voltages $PV12_1$, $PV10_1$, $PV4_1$ and $PV2_1$ are used, and the tenth N-MOS transistor N10 is turned on when the verifying voltages $PV14_1$, $PV8_1$ and $PV6_1$ are used. Information associated with activation of the transistors N10 and N12 is stored in the storing means 361 in the controller 360 as described above.

The program operation of the fourth bit Top is performed as described below when program of the third bit Higher is finished.

The program operation of the fourth bit Top is shown in FIG. 5C, Table 15 to Table 18. Since the memory cells are programmed in sequence in order of the threshold voltages like the program operations in the first bit Lower, the second bit Upper and the third bit Higher, any further description concerning the program operation of the memory cell is omitted.

In the program operation of the fourth bit Top, the twelfth N-MOS transistor N12 is turned on when the verifying voltages PV14, PV13, PV10, PV9, PV6, PV5, PV2 and PV1 are used, and the tenth N-MOS transistor N10 is turned on when the verifying voltages PV15, PV12, PV11, PV8, PV7, PV4 and PV3 are used. Information associated with activation of the transistors N10 and N12 is stored in the storing means 361 in the controller 360 as described above.

TABLE 15

| O, P & M, N State | BL | | | | | | | | SO | | | | | | | |
|---|---|---|---|---|---|---|---|---|---|---|---|---|---|---|---|---|
| CASE | I | J | K | L | M | N | O | P | I | J | K | L | M | N | O | P |
| Data Input | | | | | | | | | | | | | | | | |
| Inverse R13 | L | L | L | L | L | L | L | H | H | L | L | L | L | L | L | H | H |
| Program O, P | H | H | H | H | H | H | L | L | H | H | H | H | H | H | L | L |
| Verify PV14(QBb flag: TRANB_N on) | L | L | L | L | L | L | L/H | H | L | L | L | L | L | L | L/H | L |
| Verify PV5(QB flag: TRANB on) | L | L | L | L | L | L | L | L/H | L | L | L | L | L | L | L | L/H |
| Inverse R11 | L | L | L | L | L | H | H | H | H | L | L | L | L | L | H | H | H |
| R13 | L | L | L | L | L | L | L | H | H | L | L | L | L | L | L | H | H |
| Program M, N | H | H | H | H | L | L | H | H | H | H | H | H | L | L | H | H |
| Verify PV12(QB flag: TRANB on) | L | L | L | L | L | L/H | H | H | L | L | L | L | L/H | L | H | L |
| Verify PV13(QBb flag: TRANB_N on) | L | L | L | L | L | L | L/H | H | H | L | L | L | L | L | L/H | H | H |

| O, P & M, N State | QA | | | | | | | | QB | | | | | | | |
|---|---|---|---|---|---|---|---|---|---|---|---|---|---|---|---|---|
| CASE | I | J | K | L | M | N | O | P | I | J | K | L | M | N | O | P |
| Data Input | | | | | | | | | H | L | L | H | H | L | L | H |
| Inverse R13 | H | H | H | H | H | H | H | L | L | | | | | | | |
| Program O, P | H | H | H | H | H | H | H | L | L | | | | | | | |
| Verify PV14(QBb flag: TRANB_N on) | H | H | H | H | H | H | H | L/H | L | | | | | | | |
| Verify PV5(QB flag: TRANB on) | H | H | H | H | H | H | H | L/H | L/H | | | | | | | |
| Inverse R11 | H | H | H | H | L | L | L | L | H | L | L | H | H | L | L | H |
| R13 | H | H | H | H | L | L | H | H | | | | | | | | |
| Program M, N | H | H | H | H | L | L | H | H | | | | | | | | |
| Verify PV12(QB flag: TRANB on) | H | H | H | H | H | L/H | L | H | H | | | | | | | |
| Verify PV13(QBb flag: TRANB_N on) | H | H | H | H | H | L/H | L/H | H | H | | | | | | | |

TABLE 16

| K, L & I, J State | BL | | | | | | | | SO | | | | | | | |
|---|---|---|---|---|---|---|---|---|---|---|---|---|---|---|---|---|
| CASE | I | J | K | L | M | N | O | P | I | J | K | L | M | N | O | P |
| Inverse R9 | L | L | L | H | H | H | H | H | H | L | L | L | H | H | H | H | H |
| R11 | L | L | L | L | L | H | H | H | H | L | L | L | L | L | H | H | H |
| Program K, L | H | H | H | L | L | H | H | H | H | H | H | H | L | L | H | H | H |
| Verify PV10(QBb flag: TRANB_N on) | L | L | L | L/H | L/H | H | H | H | H | L | L | L | L/H | L/H | H | H | H |
| Verify PV11(QB flag: TRANB on) | L | L | L | L | L/H | H | H | H | H | L | L | L | L | L/H | H | H | H |
| Inverse R7 | L | H | H | H | H | H | H | H | H | L | L | H | H | H | H | H | H |
| R9 | L | L | L | H | H | H | H | H | H | L | L | L | H | H | H | H | H |
| Program I, J | H | L | L | H | H | H | H | H | H | H | L | L | H | H | H | H | H |
| Verify PV8(QB flag: TRANB on) | L | L/H | H | H | H | H | H | H | L | L/H | H | H | H | H | H | H |
| Verify PV9(QBb flag: TRANB_N on) | L | L/H | L/H | H | H | H | H | H | L | L/H | L/H | H | H | H | H | H |

| K, L & I, J State | QA | | | | | | | | QB | | | | | | | |
|---|---|---|---|---|---|---|---|---|---|---|---|---|---|---|---|---|
| CASE | I | J | K | L | M | N | O | P | I | J | K | L | M | N | O | P |
| Inverse R9 | H | H | H | L | L | L | L | L | H | L | L | H | H | L | L | H |
| R11 | H | H | H | L | L | H | H | H | | | | | | | | |
| Program K, L | H | H | H | L | L | H | H | H | | | | | | | | |
| Verify PV10(QBb flag: TRANB_N on) | H | H | H | L/H | L | H | H | H | | | | | | | | |
| Verify PV11(QB flag: TRANB on) | H | H | H | L/H | L/H | H | H | H | | | | | | | | |
| Inverse R7 | H | L | L | L | L | L | L | L | H | L | H | L | H | L | H | L |
| R9 | H | L | L | H | H | H | H | H | | | | | | | | |
| Program I, J | H | L | L | H | H | H | H | H | | | | | | | | |
| Verify PV8(QB flag: TRANB on) | H | L/H | L | H | H | H | H | H | | | | | | | | |
| Verify PV9(QBb flag: TRANB_N on) | H | L/H | L/H | H | H | H | H | H | | | | | | | | |

TABLE 17

| G, H & E, F State | BL | | | | | | | | SO | | | | | | | |
|---|---|---|---|---|---|---|---|---|---|---|---|---|---|---|---|---|
| CASE | A | B | C | D | E | F | G | H | A | B | C | D | E | F | G | H |
| Inverse R5 | L | L | L | L | L | L | H | H | L | L | L | L | L | L | H | H |
| R7 | L | L | L | L | L | L | L | L | L | L | L | L | L | L | L | L |
| Program G, H | H | H | H | H | H | H | L | L | H | H | H | H | H | H | L | L |
| Verify PV6(QBb flag: TRANB_N on) | L | L | L | L | L | L | L/H | H | L | L | L | L | L | L | L/H | H |
| Verify PV7(QB flag: TRANB on) | L | L | L | L | L | L | L | L/H | L | L | L | L | L | L | L | L/H |
| Inverse R3 | L | L | L | L | H | H | H | H | L | L | L | L | H | H | H | H |
| R5 | L | L | L | L | L | L | H | H | L | L | L | L | L | L | H | H |
| Program E, F | H | H | H | H | L | L | H | H | H | H | H | H | L | L | H | H |
| Verify PV4(QB flag: TRANB on) | L | L | L | L | L/H | H | H | H | L | L | L | L | L/H | H | H | H |
| Verify PV5(QBb flag: TRANB_N on) | L | L | L | L | L/H | L/H | H | H | L | L | L | L | L/H | L/H | H | H |

| G, H & E, F State | QA | | | | | | | | QB | | | | | | | |
|---|---|---|---|---|---|---|---|---|---|---|---|---|---|---|---|---|
| CASE | A | B | C | D | E | F | G | H | A | B | C | D | E | F | G | H |
| Inverse R5 | H | H | H | H | H | H | L | L | H | L | L | H | H | L | L | H |
| R7 | H | H | H | H | H | H | L | L | | | | | | | | |
| Program G, H | H | H | H | H | H | H | L | L | | | | | | | | |
| Verify PV6(QBb flag: TRANB_N on) | H | H | H | H | H | H | L/H | L | | | | | | | | |
| Verify PV7(QB flag: TRANB on) | H | H | H | H | H | H | L/H | L/H | | | | | | | | |
| Inverse R3 | H | H | H | H | L | L | L | L | H | L | L | H | H | L | L | H |
| R5 | H | H | H | H | L | L | H | H | | | | | | | | |
| Program E, F | H | H | H | H | L | L | H | H | | | | | | | | |
| Verify PV4(QB flag: TRANB on) | H | H | H | H | L/H | L | H | H | | | | | | | | |
| Verify PV5(QBb flag: TRANB_N on) | H | H | H | H | L/H | L/H | H | H | | | | | | | | |

TABLE 18

| C, D & A, B State | BL | | | | | | | | SO | | | | | | | |
|---|---|---|---|---|---|---|---|---|---|---|---|---|---|---|---|---|
| CASE | A | B | C | D | E | F | G | H | A | B | C | D | E | F | G | H |
| Inverse R1 | L | L | H | H | H | H | H | H | L | L | H | H | H | H | H | H |
| R3 | L | L | L | L | H | H | H | H | L | L | L | L | H | H | H | H |
| Program C, D | H | H | L | L | H | H | H | H | H | H | L | L | H | H | H | H |
| Verify PV2(QBb flag: TRANB_N on) | L | L | L/H | H | H | H | H | H | L | L | L/H | H | H | H | H | H |
| Verify PV3(QB flag: TRANB on) | L | L | L/H | L/H | H | H | H | H | L | L | L/H | L/H | H | H | H | H |
| R1 | L | L | H | H | H | H | H | H | L | L | H | H | H | H | H | H |
| Transf(QB to QA) | | | | | | | | | H | L | L | H | H | L | L | H |
| Program A, B | H | L | H | H | H | H | H | H | H | L | H | H | H | H | H | H |
| Verify PV1(QBb flag: TRANB_N on) | L | L/H | H | H | H | H | H | H | L | L/H | H | H | H | H | H | H |

| C, D & A, B State | QA | | | | | | | | QB | | | | | | | |
|---|---|---|---|---|---|---|---|---|---|---|---|---|---|---|---|---|
| CASE | A | B | C | D | E | F | G | H | A | B | C | D | E | F | G | H |
| Inverse R1 | H | H | L | L | L | L | L | L | H | L | L | H | H | L | L | H |
| R3 | H | H | L | L | H | H | H | H | | | | | | | | |
| Program C, D | H | H | L | L | H | H | H | H | | | | | | | | |
| Verify PV2(QBb flag: TRANB_N on) | H | H | L/H | L | H | H | H | H | | | | | | | | |
| Verify PV3(QB flag: TRANB on) | H | H | L/H | L/H | H | H | H | H | | | | | | | | |
| R1 | L | L | H | H | H | H | H | H | H | L | L | H | H | L | L | H |
| Transf(QB to QA) | H | L | H | H | H | H | H | H | | | | | | | | |
| Program A, B | H | L | H | H | H | H | H | H | | | | | | | | |
| Verify PV1(QBb flag: TRANB_N on) | H | L/H | H | H | H | H | H | H | | | | | | | | |

Figure 6:
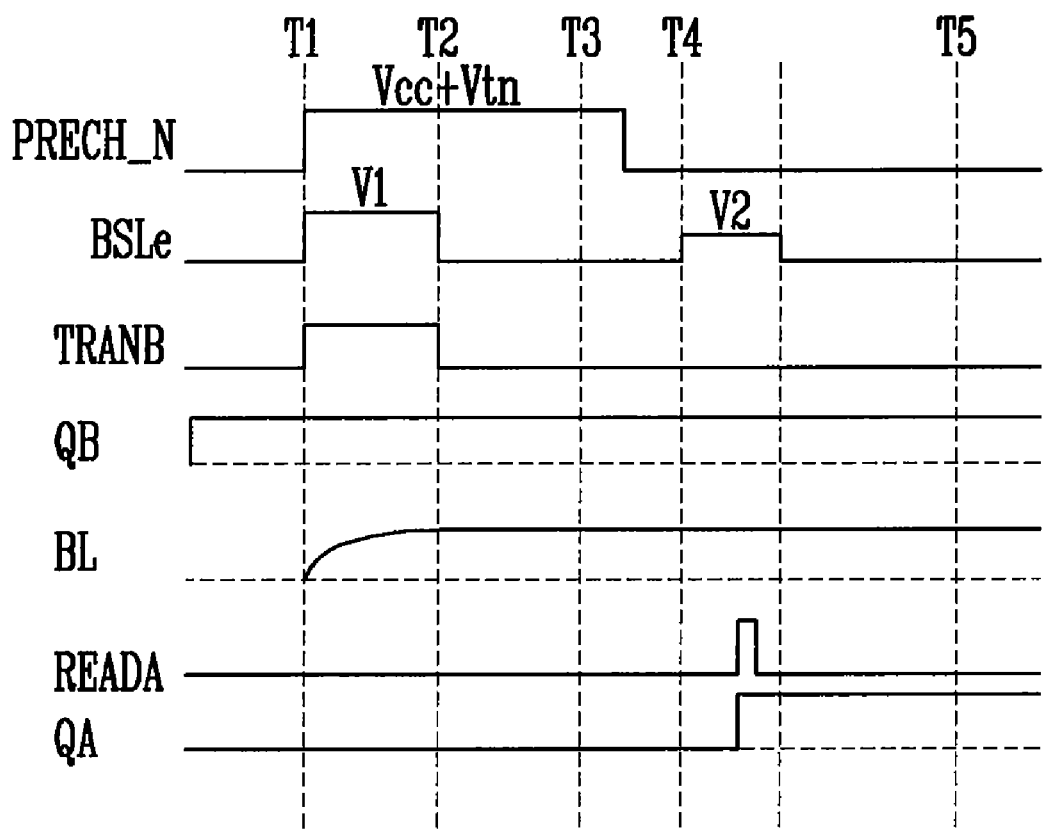
FIG. 6 is a timing diagram illustrating signals in the page buffer using the flag according to one example embodiment of the present invention.

FIG. 6 is a timing diagram illustrating signals in the page buffer using the flag according to one example embodiment of the present invention. Specially, FIG. 6 shows a change of the node QA in accordance with a state of the node QB for verifying the program when the second bit Upper is programmed as shown in FIG. 5B.

As shown in FIG. 6, when the program is finished, the data of the node QA are converted into '1' in accordance with the voltage level of the node QB. As a result, the program operation is not performed. When every node QA in every page buffer has '1', it is determined that a corresponding program operation is finished. Accordingly, an operation following the program operation may be started.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with the other embodiments.

Although the present invention been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A page buffer in a memory device having a multi level cell, the page buffer comprising:
   a first latch coupled between a sensing node and a data input/output node, and configured to store temporarily data to be programmed, wherein the sensing node is coupled to a bit line corresponding to a multi level cell selected for program, and the data input/output node receives data from an outside device or outputs data to the outside device;
   a second latch coupled to the sensing node, and configured to perform a program operation, a verifying operation or a read operation for reading data from the selected multi level cell;
   a first switching means coupled between the first latch and the sensing node, and configured to transmit the data stored in the first latch to the bit line through the sensing node when the program operation is performed;
   a second switching means coupled between a first node of the second latch and the sensing node, and configured to verify a first program operation of first data; and
   a third switching means coupled between a second node of the second latch and the sensing node, and configured to verify a second program operation of second data,
   wherein the first and second program operations are different.

2. The page buffer of claim 1, further comprising:
   a bit line selecting circuit configured to couple a selected bit line to the sensing node, wherein the bit line is selected when the program operation or the read operation is performed.

3. The page buffer of claim 1, wherein data '1' is converted into data '0' in the first program operation, and the second program operation corresponds to the program operation except the first program operation.

4. The page buffer of claim 1, wherein data '0' is converted into data '1' in the first program operation, and the second program operation corresponds to the program operation except the first program operation.

5. The page buffer of claim 1, wherein the second switching means or the third switching means operates in accordance with a first verifying voltage for verifying the first program operation and a second verifying voltage for verifying the second program operation.

6. A memory device having a multi level cell, the memory device comprising:
   a memory cell array configured to have a plurality of multi level cells coupled to pairs of bit lines and word lines;
   page buffers corresponding to each of the pairs of the bit lines, configured to output data to be programmed to one of the multi level cells coupled to one pair of the bit lines when a program operation is performed, and verify the program operation through at least two switching means; and
   a controller configured to control the program operation, and control a verifying operation for verifying the program operation by controlling the switching means, wherein the verifying operation is performed in accordance with a verifying voltage,
   wherein the page buffer includes:
   a first latch coupled between a sensing node and a data input/output node, and configured to store temporarily data to be programmed, wherein the sensing node is coupled to the bit line corresponding to a multi level cell selected for program, and the data input/output node receives data from an outside device or outputs data to the outside device;
   a second latch coupled to the sensing node, and configured to perform a program operation, a verifying operation or a read operation for reading data from the selected multi level cell;
   a first switching means coupled between the first latch and the sensing node, and configured to transmit the data stored in the first latch to the bit line through the sensing node when the program operation is performed;
   a second switching means coupled between a first node of the second latch and the sensing node, and configured to verify a first program operation of first data; and
   a third switching means coupled between a second node of the second latch and the sensing node, and configured to verify a second program operation of second data,
   wherein the first and second program operations are different.

7. The memory device of claim 6, wherein the page buffer further includes:
   a bit line selecting circuit configured to couple a selected bit line to the sensing node, wherein the bit line is selected when the program operation or the read operation is performed.

8. The memory device of claim 6, wherein data '1' is converted into data '0' in the first program operation, and the second program operation corresponds to the program operation except the first program operation.

9. The memory device of claim 6, wherein data '0' is converted into data '1' in the first program operation, and the second program operation corresponds to the program operation except the first program operation.

10. The memory device of claim 6, wherein the second switching means or the third switching means operates in accordance with a first verifying voltage for verifying the first program operation and a second verifying voltage for verifying the second program operation.

11. The memory device of claim 10, wherein information related to operation of the second switching means or the third switching means is stored in a storing means in the controller.

* * * * *